US012074611B2

(12) United States Patent
Kumbaranthodiyil

(10) Patent No.: US 12,074,611 B2
(45) Date of Patent: Aug. 27, 2024

(54) HIGH SPEED SAR ADC

(71) Applicant: Analog Devices International Unlimited Company, Limerick (IE)

(72) Inventor: Mahesh Madhavan Kumbaranthodiyil, Kerala (IN)

(73) Assignee: Analog Devices International Unlimited Company, Limerick (IE)

( * ) Notice: Subject to any disclaimer, the term of this patent is extended or adjusted under 35 U.S.C. 154(b) by 156 days.

(21) Appl. No.: 17/829,998

(22) Filed: Jun. 1, 2022

(65) Prior Publication Data

US 2023/0396264 A1 Dec. 7, 2023

(51) Int. Cl.
*H03M 1/72* (2006.01)
*H03M 1/12* (2006.01)
*H03M 1/46* (2006.01)

(52) U.S. Cl.
CPC ............. *H03M 1/72* (2013.01); *H03M 1/124* (2013.01); *H03M 1/466* (2013.01)

(58) Field of Classification Search
None
See application file for complete search history.

(56) References Cited

U.S. PATENT DOCUMENTS

| | | | | |
|---|---|---|---|---|
| 6,970,126 B1* | 11/2005 | O'Dowd | ................. | H03M 3/34 341/172 |
| 7,015,841 B2 | 3/2006 | Yoshida et al. | | |
| 7,180,805 B2* | 2/2007 | Schnabel | .............. | G11C 11/406 365/222 |
| 7,199,745 B2 | 4/2007 | Tachibana et al. | | |
| 9,391,624 B1 | 7/2016 | Srinivasa et al. | | |
| 9,432,044 B1* | 8/2016 | Lee | ..................... | H03M 1/1061 |
| 9,647,676 B2 | 5/2017 | Srinivasa et al. | | |
| 10,097,198 B1 | 10/2018 | Lee et al. | | |
| 10,516,411 B1* | 12/2019 | Monangi | ................. | H03M 1/68 |
| 10,547,321 B2 | 1/2020 | Vinje et al. | | |
| 10,917,105 B1* | 2/2021 | Ayman | .................. | H03L 7/0812 |
| 10,938,402 B1* | 3/2021 | Hsu | ......................... | H03M 1/66 |
| 2004/0246159 A1* | 12/2004 | Leung | ................. | H03M 1/1057 341/172 |
| 2005/0093726 A1* | 5/2005 | Hezar | .................. | H03M 3/412 341/143 |

(Continued)

OTHER PUBLICATIONS

Kardonik, *A Study of SAR DAC and Implementation of 10-bit Asynchronous Design*, University of Texas at Austin, Aug. 2013, 75 pages.

(Continued)

*Primary Examiner* — Lam T Mai
(74) *Attorney, Agent, or Firm* — Schwegman Lundberg & Woessner, P.A.

(57) ABSTRACT

High speed, high dynamic range SAR ADC method and architecture. The SAR DAC comparison method can make fewer comparisons with less charge/fewer capacitors. The architecture makes use of a modified top plate switching (TPS) DAC technique and therefore achieves very high-speed operation. The present disclosure proffers a unique SAR ADC method of input and reference capacitor DAC switching. This benefits in higher dynamic range, no external decoupling capacitory requirement, wide common mode range and overall faster operation due to the absence of mini-ADC.

20 Claims, 17 Drawing Sheets

(56) References Cited

U.S. PATENT DOCUMENTS

| | | | | |
|---|---|---|---|---|
| 2006/0176205 A1* | 8/2006 | Kawahito | .............. | H04N 1/195 |
| | | | | 341/155 |
| 2010/0188278 A1* | 7/2010 | Khanna | ................ | H03M 1/466 |
| | | | | 341/172 |
| 2011/0089977 A1* | 4/2011 | Hunter | .................... | H03K 5/24 |
| | | | | 327/65 |
| 2013/0082684 A1* | 4/2013 | Spalding, Jr. | .......... | G01R 15/06 |
| | | | | 324/111 |
| 2014/0152482 A1* | 6/2014 | Hoshino | ................ | H03M 1/12 |
| | | | | 327/307 |
| 2015/0214969 A1* | 7/2015 | Lien | ...................... | H03M 1/002 |
| | | | | 341/161 |
| 2016/0079995 A1* | 3/2016 | Zare-Hoseini | ........ | H03M 1/403 |
| | | | | 341/120 |
| 2016/0329906 A1* | 11/2016 | Patukuri | .............. | G01S 17/894 |
| 2017/0012637 A1* | 1/2017 | Venca | .................... | H03M 1/68 |
| 2020/0135281 A1* | 4/2020 | Kim | ...................... | G11C 16/12 |
| 2023/0198541 A1* | 6/2023 | Kumbaranthodiyil | ...................... | |
| | | | | H03M 1/124 |
| | | | | 341/161 |

OTHER PUBLICATIONS

Lin et al., *An Innovative Successive Approximation Register Analog-to-Digital Converter for a Nine-Axis Sensing System*, Journal of Low Power Electronics and Applications, Appl. 2021, 11, 24 pages.

\* cited by examiner

HIGH SPEED SAR ADC

CROSS-REFERENCE TO RELATED APPLICATIONS

This Application is related to U.S. application Ser. No. 17/558,610 filed Dec. 22, 2021, entitled "ALGORITHM FOR HIGH SPEED SAR ADC," which is hereby incorporated herein in its entirety.

FIELD OF THE DISCLOSURE

This document pertains generally, but not by way of limitation, to integrated circuits, and more particularly, to analog-to-digital converter circuits and systems.

BACKGROUND

Analog signals and/or values can be produced in various kinds of circuit elements, such as signal generators, sensors, and antennas. However, there can be many instances where having digital signals or values can be beneficial, such as for a processing or storing of the signals or values. To utilize the benefits of having a digital signal or value when an analog signal or value has been produced, analog-to-digital converters (ADCs) have been developed to convert the analog signal or value into a digital signal or value.

A signal may be a time-based sequence of values. A digital value may be represented by a code. A name of a code (for example, CODE1) may refer to a digital value represented by the code. Some (but not all) digital values may be represented by codes using binary-weighted encoding. A resolution of a digital value or code expressed in terms of a number of bits may refer to a binary-weighted encoding, regardless of how it may be encoded.

In many electronics applications, analog input values are converted to digital output values (for example, for further digital processing or storage). For instance, in precision measurement systems, electronics are provided with one or more sensors to make measurements, and these sensors may generate analog values. The analog values may be provided as an input to an ADC to generate digital output values for further processing or storage.

ADCs can be found in many places such as broadband communication systems, automated test equipment, audio systems, vehicles, factory automation systems, etc. ADCs can translate analog electrical values representing real-world phenomena, e.g., light, sound, temperature, flow, or pressure. Designing an ADC is a non-trivial task because each application may have different needs in speed, performance, power, cost and size. As the applications needing ADCs grow, the need for accurate and reliable conversion performance also grows.

It is a general object of the present invention to provide a successive approximation A/D converter that substantially obviates one or more problems caused by the limitations and disadvantages of the related art.

Features and advantages of the present invention will be presented in the description which follows, and in part will become apparent from the description and the accompanying drawings or may be learned by practice of the invention according to the teachings provided in the description. Objects as well as other features and advantages of the present invention will be realized and attained by a successive approximation A/D converter particularly pointed out in the specification in such full, clear, concise, and exact terms as to enable a person having ordinary skill in the art to practice the invention.

There is a demonstrated need in the art for a wider common mode range for both reference and input and a reference buffer which is easier to design. There is also a demonstrated need to remove the mini-ADCs which are present in many systems. The inventors of the present disclosure have recognized that an impediment to low power and higher speeds. As such, the inventors contemplate a new comparison algorithm.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

SUMMARY OF THE DISCLOSURE

High speed, high dynamic range SAR ADC method and architecture. The SAR DAC comparison method can make fewer comparisons with less charge/fewer capacitors. The architecture makes use of a modified top plate switching (TPS) DAC technique and therefore achieves very high-speed operation. The present disclosure proffers a unique SAR ADC method of input and reference capacitor DAC switching.

This benefits in removing the requirement for a mini-ADC for the same input swings. Therefore, this achieves better input bandwidth/redundancy usage compared to mini-ADC type architectures.

This also benefits in higher dynamic range for lower level input. The switching scheme results in lower reference caps for lower inputs thereby achieving lower input referred noise gain of residual amplifier (RA) and lower attenuation for ADC comparator inputs. The inventor of the present disclosure has recognized a 6 dB SNR improvement over traditional T/H based ADCs. This also make T/H based architecture more attractive for wide common mode range implementation as there is no need for two parallel mini-ADCs. This achieves lower complexity and consequently lower area and less power consumption. As such, the speed of the state-of-the-art architectures are maintained (and even exploited) without any reduction to SNR due to attenuation of reference caps, in addition to intention attenuation of caps of the DAC top plate to control voltage swing.

The present disclosure utilizes an ADC architecture which has symmetrical reference and input paths. This can be generalized to make a state-of-the-art "digitizer" that outputs the ratio of two inputs. So, instead of converting two inputs (using sim sampling ADC) and taking their ratio digitally, the generic form of this architecture could give that result using half the circuit layout area. The generic form of one or more embodiments has the ability to convert inputs greater than reference for overranging inputs.

Since the conversion happens entirely internal to the ADC block and no external signals like reference used during, it makes for a good candidate for embedded SAR which could run with no external decoupling capacitor. Also, the benefits in that the DAC resistances can be better controlled and easier for DAC design to make for very fast settling by matching the time constants in each DAC element.

Another advantage of the present disclosure is an inbuilt and on-demand redundancy. A redundancy can be implemented without affecting the attenuation inputs due to extra capacitors in the conversion DAC for inputs inside the [0, VREF] range. The existing DAC capacitors can be manipulated to generate voltage levels needed for redundancy implementation without needing additional caps tied to REF/GND on the conversion DAC. Extra redundant cap can be included with more segments in the reference DAC than required to attend to overranging. This can be added if the input is outside the rails, and therefore the SNR hit due to redundancy cap attenuation is only for inputs greater than full scale or less than negative full scale.

To achieve these and other advantages in accordance with the purpose of the invention, the disclosure provides a successive approximation A/D converter and algorithm thereof, which includes a sample-hold amplifier circuit configured to sample and hold an input analog voltage to produce at an output node an internal analog voltage proportional to the input analog voltage with a voltage gain being smaller than 1, a switched capacitor D/A converter coupled to the output node of the sample-hold amplifier circuit and including a plurality of capacitors for storing electric charge responsive to the internal analog voltage, the switched capacitor D/A converter configured to switch couplings of the capacitors in response to a control signal to produce at an output node a comparison analog voltage responsive to the internal analog voltage and the control signal, a comparator coupled to the output node of the switched capacitor D/A converter to produce at an output node a comparison result signal responsive to the comparison analog voltage, and a control circuit coupled to the output node of the comparator to supply the control signal responsive to the comparison result signal to the switched capacitor D/A converter.

The drawings show exemplary SAR circuits and configurations. Variations of these circuits, for example, changing the positions of, adding, or removing certain elements from the circuits are not beyond the scope of the present invention. The illustrated circuits, configurations, and complementary devices are intended to be complementary to the support found in the detailed description.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

For a fuller understanding of the nature and advantages of the present invention, reference is made to the following detailed description of preferred embodiments and in connection with the accompanying drawings, in which.

DETAILED DESCRIPTION

SAR analog-to-digital converters utilize a binary weighted capacitor array which is operable to operate in a tracking or sample mode wherein an input voltage is sampled onto one plate of a plurality of capacitors in the array. After sampling, the SAR converter is placed in a convert mode. In the convert mode, the plates of the capacitors that were connected to the input voltage are selectively connected between ground and a reference voltage. A comparator connected to the other plate of the capacitors is operable to compare the voltage on that plate with the threshold voltage in accordance with a conventional SAR search algorithm.

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

In many electronics applications, an analog input signal is converted to a digital output signal (e.g., for further digital signal processing). For instance, in measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

Embodiments generally relate to electronic circuit designs, and more specifically to improvements in architectural arrangements which enable enhanced performance and/or features for sampling receivers, and specifically to direct conversion sampling receivers which include a successive approximation analog-to-digital converter (SAR-ADC) to enhance quality of sampling receivers, where the SAR-ADC incorporates a charge redistribution digital-to-analog converter (DAC) and where filtering is implemented in the radio frequency (RF) domain by at least reusing a capacitor arrays which form all or part of the DAC within the SAR ADC.

Figure 1A:
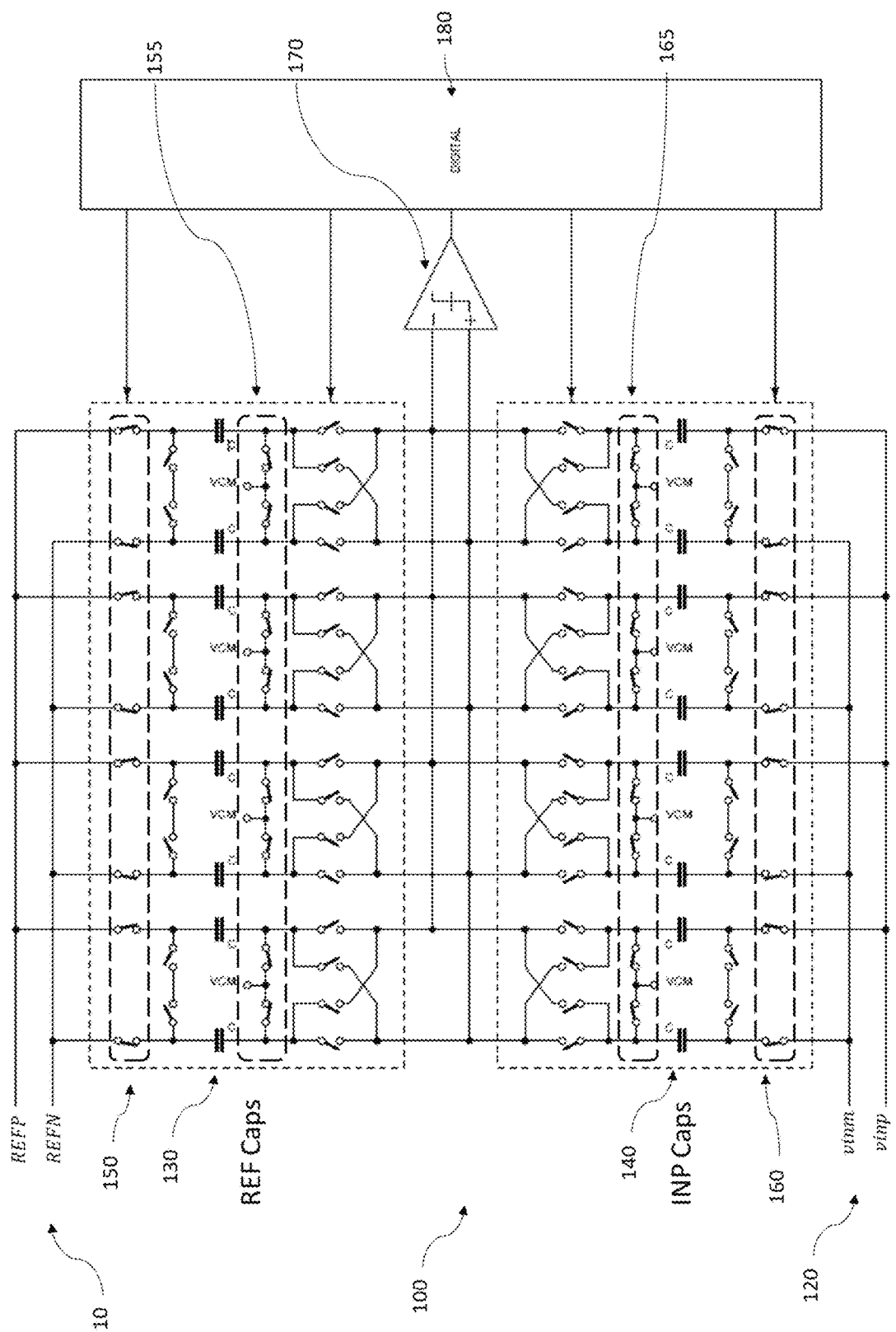
FIGS. 1A-D depict exemplary successive approximation ADCs, in accordance with some embodiments of the disclosure provided herein.

FIGS. 1A-D depict exemplary successive approximation ADCs, in accordance with some embodiments of the disclosure provided herein. FIGS. 1A-D also show an exemplary 2-bit process, the method of which can easily scaled up for higher resolution, as one skilled in the art can appreciate. Turning to FIG. 1A, SAR-ADC 100 comprises reference inputs 110, reference charging switches 150, reference caps 130, bridge switches 155, comparator 170, controller 180, input bridge switches 165, input caps 140, input charging switches 160, and inputs 120.

Comparator 170 is a heuristic depiction of a comparator. A comparator is a device that compares two voltages or currents and outputs a digital signal indicating which is larger. A comparator consists of a specialized high-gain differential amplifier. They are commonly used in devices that measure and digitize analog signals, such as successive-approximation ADCs, as well as relaxation oscillators. A successive-approximation ADC is a type of analog-to-digital converter that converts a continuous analog waveform into a discrete digital representation using a binary search through all possible quantization levels before finally converging upon a digital output for each conversion.

The successive-approximation analog-to-digital converter circuit typically consists of four chief subcircuits. A sample-and-hold circuit to acquire the input voltage Vin. An analog voltage comparator that compares Vin to the output of the internal DAC and outputs the result of the comparison to the successive-approximation register (SAR). A successive-approximation register subcircuit designed to supply an approximate digital code of Vin to the internal DAC. An internal reference DAC that, for comparison with Vref, supplies the comparator with an analog voltage equal to the digital code output of the SARin.

Commonly in the art, the successive approximation register is initialized so that the most significant bit (MSB) is equal to a digital 1. This code is fed into the DAC, which then supplies the analog equivalent of this digital code (Vref/2) into the comparator circuit for comparison with the sampled input voltage. If this analog voltage exceeds Vin, then the comparator causes the SAR to reset this bit; otherwise, the bit is left as 1. Then the next bit is set to 1 and the same test is done, continuing this binary search until every bit in the SAR has been tested. The resulting code is the digital approximation of the sampled input voltage and is finally output by the SAR at the end of the conversion (EOC).

Contrary to traditional SAR-ADCs, the present disclosure gives rise to implementing the systems and methods found in U.S. application Ser. No. 17/558,610 filed Nov. 12, 2020, entitled "ALGORITHM FOR HIGH SPEED SAR ADC," which is hereby incorporated herein in its entirety. As such, the embodiments disclosed herein are best viewed in the context of those algorithms.

Turing back, FIG. 1A illustrates the sampling of the input and reference voltages in a 2-bit SAR example. In practice input and ref voltages are acquired at the same time from inputs 120 and ref inputs 110, respectively. On the ref side, reference charging switches 150 and ref bridge switches 155 are closed to allow ref inputs 110 to charge ref caps 130. On the input sampling side, input charging switches 160 and input bridge switches 165 are closed to allow inputs 120 to charge input caps 140.

In one embodiment, the controller 180 is a digital circuit controls the timing and switching of the switches. However, any suitable integrated circuit or device is not beyond the scope of the present invention. For example, the controller and/or other circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the clocking and filtering functionalities may be implemented in one or more silicon cores in Application Specific Integrated Circuits (ASICs), Field Programmable Gate Arrays (FPGAs), and other semiconductor chips.

Figure 1B:
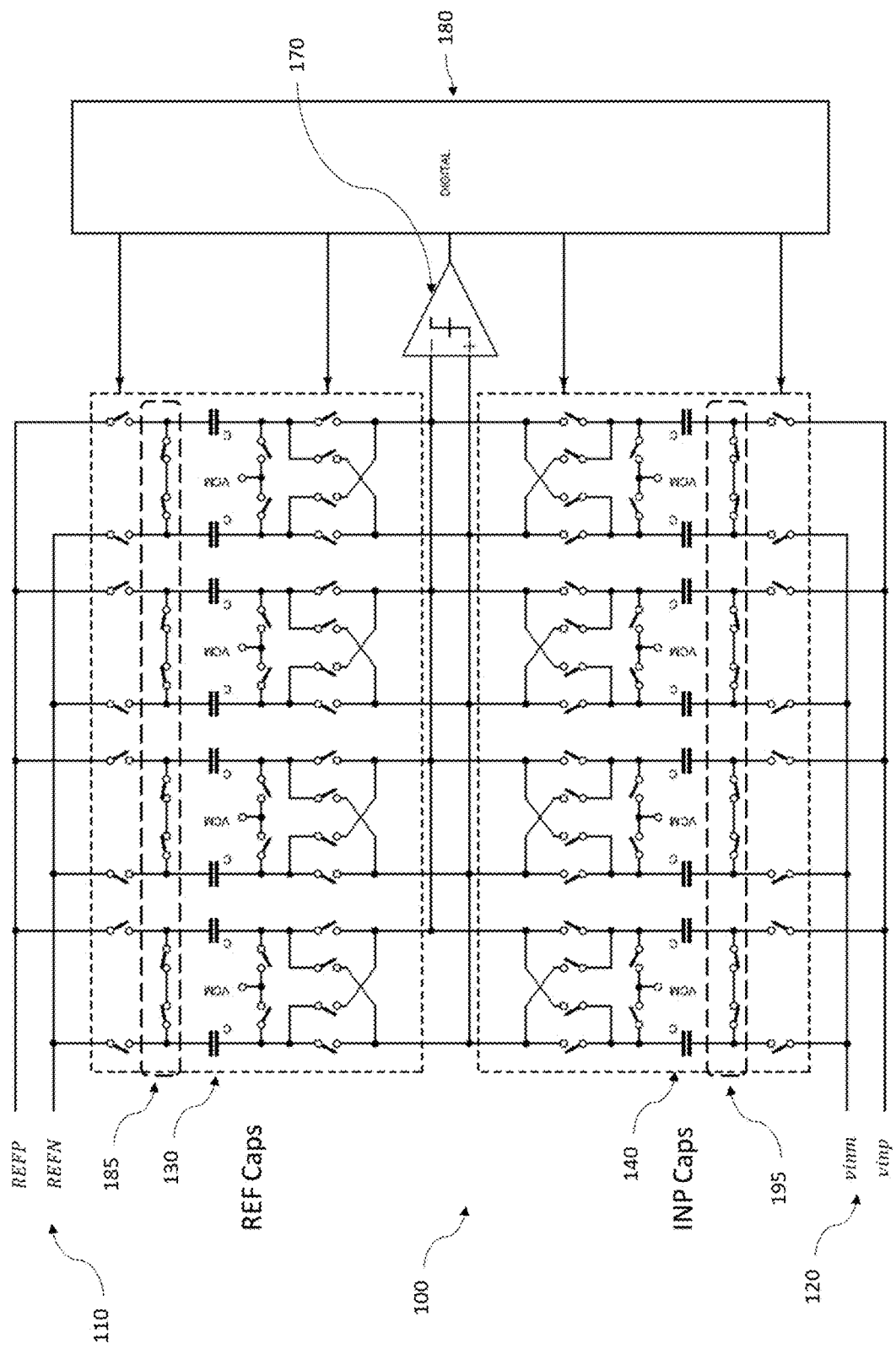

Turing to FIG. 1B, SAR-ADC 100 comprises reference inputs 110, reference charging switches 150, reference caps 130, ref bridge switches 155, ref balance switches 185, comparator 170, controller 180, input bridge switches 165, input caps 140, input charging switches 160, input balance switches 195, and inputs 120. The present switching generates the necessary voltages on each cell, the details of which are now discussed.

As can be appreciated by one skilled in the art, ref balance switches 185 and input balance switches 195 are closed; reference charging switches 150 and input charging switches 160 are opened; and ref bridge switches 155 and input bridge switches 165 are opened. This provides the proper charging of the top plates while isolating from input and reference voltages.

Figure 1C:
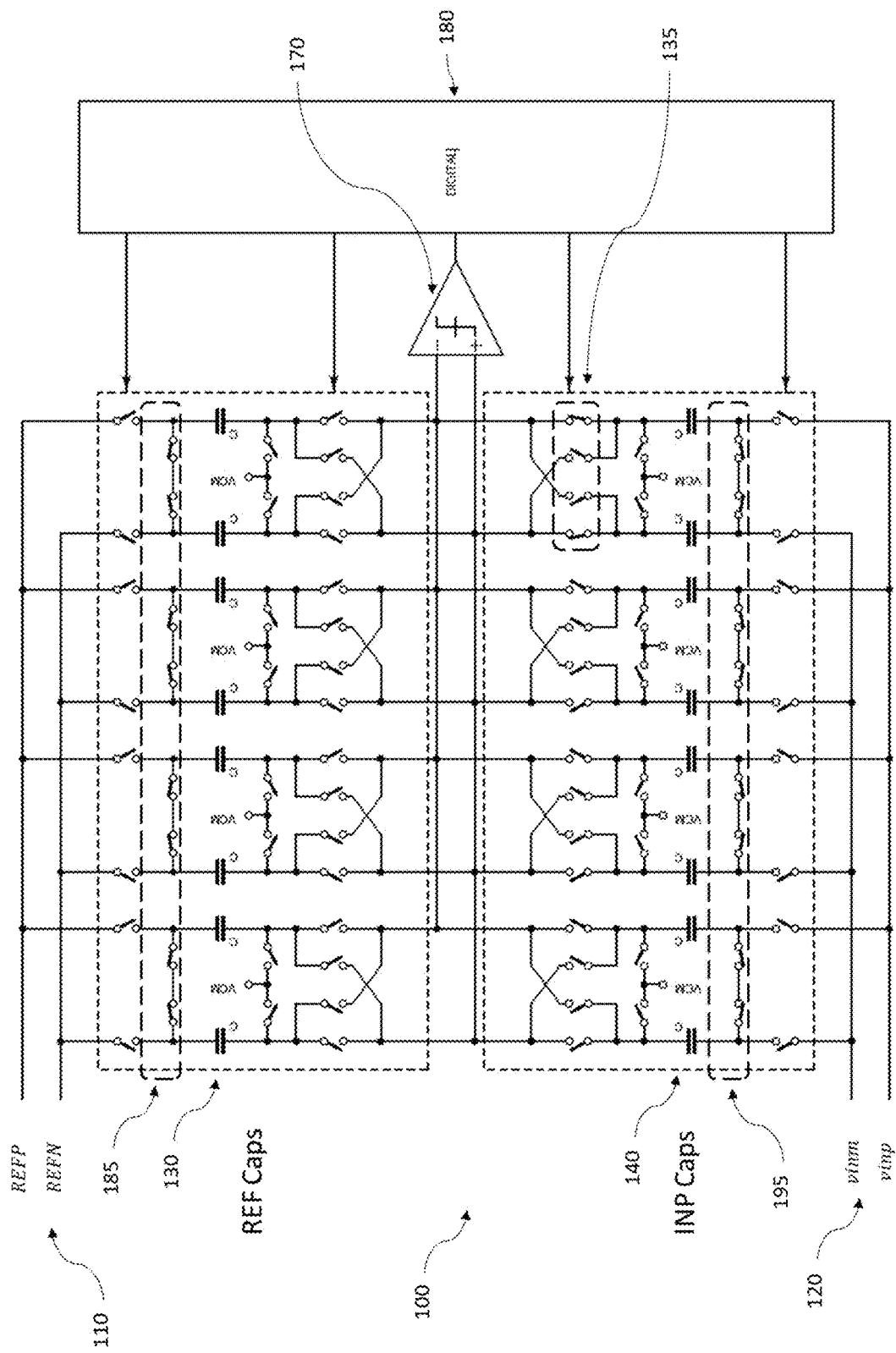

Turing to FIG. 1C, SAR-ADC 100 comprises reference inputs 110, reference charging switches 150, reference caps 130, ref bridge switches 155, ref balance switches 185, comparator 170, controller 180, input bridge switches 165, input caps 140, input charging switches 160, input balance switches 195, and inputs 120. According to some embodiments, the first step is to check the polarity of the sampled input. This results in the identification of the sign bit during a sign bit trial.

As can be appreciated by one skilled in the art, a single input cell 135 is for the sign bit trial. The two outer switches of input cell 135 are closed which creates a conductive path to the comparator 170. Conversely, the inner cross switches can also be used with the notion that the operator knows of the opposite polarity. This result is the sign bit. Typically, the sign bit is a 1 or 0 in binary, which is used to denote positive/negative or forward/reverse bias, etc. However, any numbering or identification system is not beyond the scope of the present disclosure. For edification purposed, it is assumed that sign bit is 1.

Figure 1D:
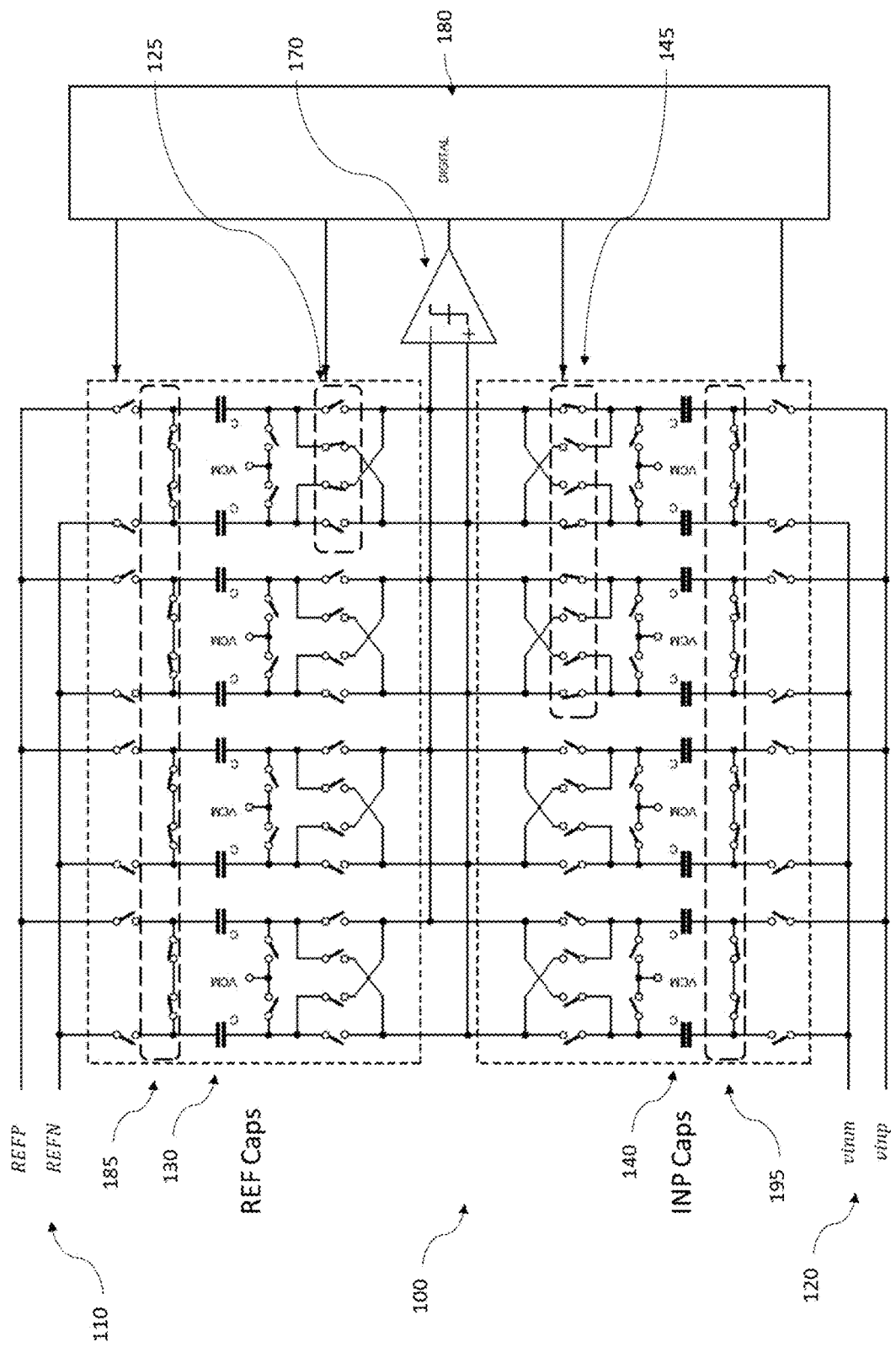

Turing to FIG. 1D, SAR-ADC 100 comprises reference inputs 110, reference charging switches 150, reference caps 130, ref bridge switches 155, ref balance switches 185, comparator 170, controller 180, input bridge switches 165, input caps 140, input charging switches 160, input balance switches 195, and inputs 120. According to some embodiments, the next step is to perform most significant bit (MSB) trial.

With the algorithm disclosed in U.S. application Ser. No. 17/558,610 filed Nov. 12, 2020, entitled "ALGORITHM FOR HIGH SPEED SAR ADC," in mind, two input cells 145 are now compared to a single reference cell 125. The switching choices—either straight or crossed—within the cell is determined by the sign bit. As can be appreciated by one skilled in the art, each subsequent switching choice for both the input and reference cells is based on the previous trial.

Figure 2A:
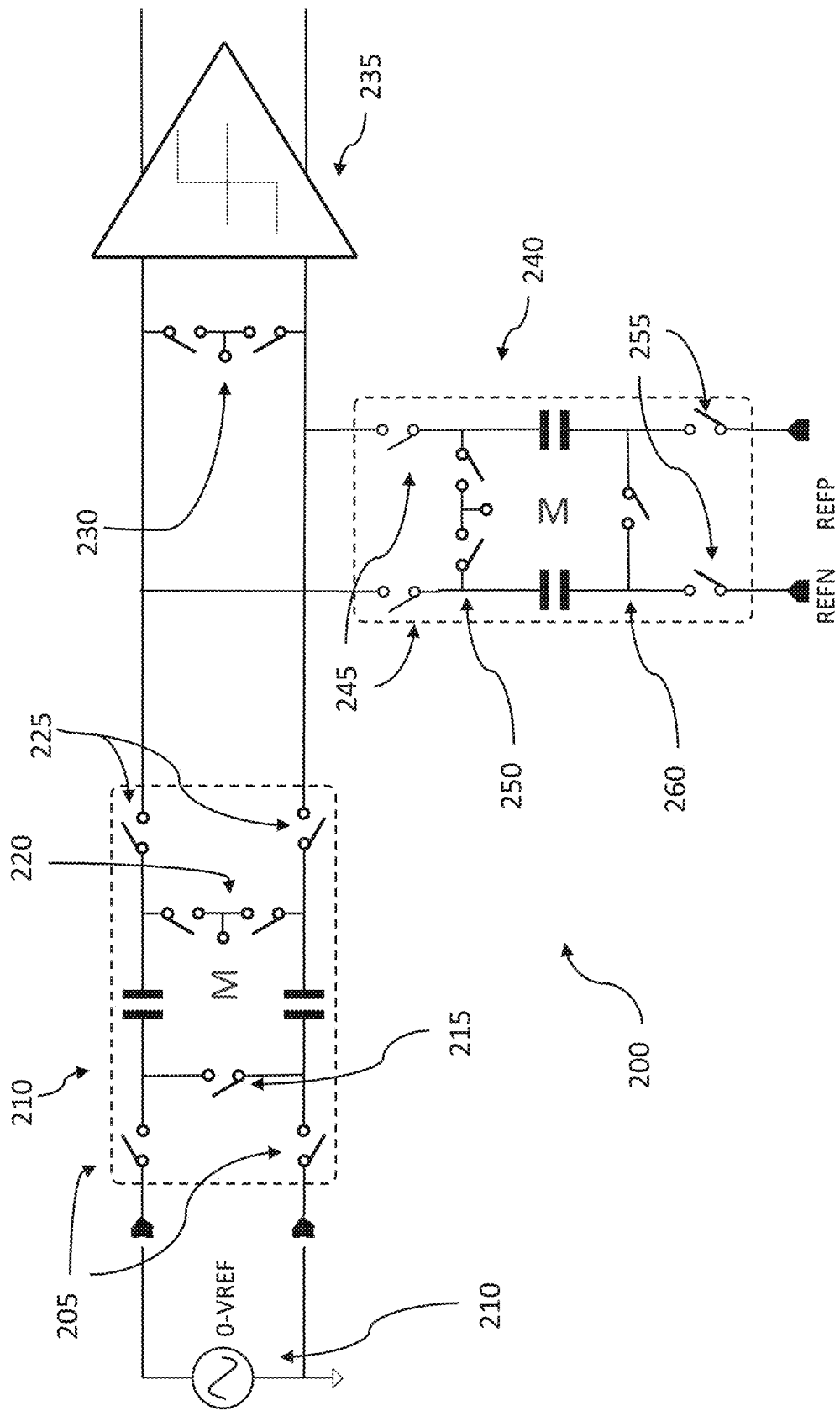
FIGS. 2A-B illustrate exemplary novel successive approximation ADCs, in accordance with some embodiments of the disclosure provided herein.
Figure 2B:
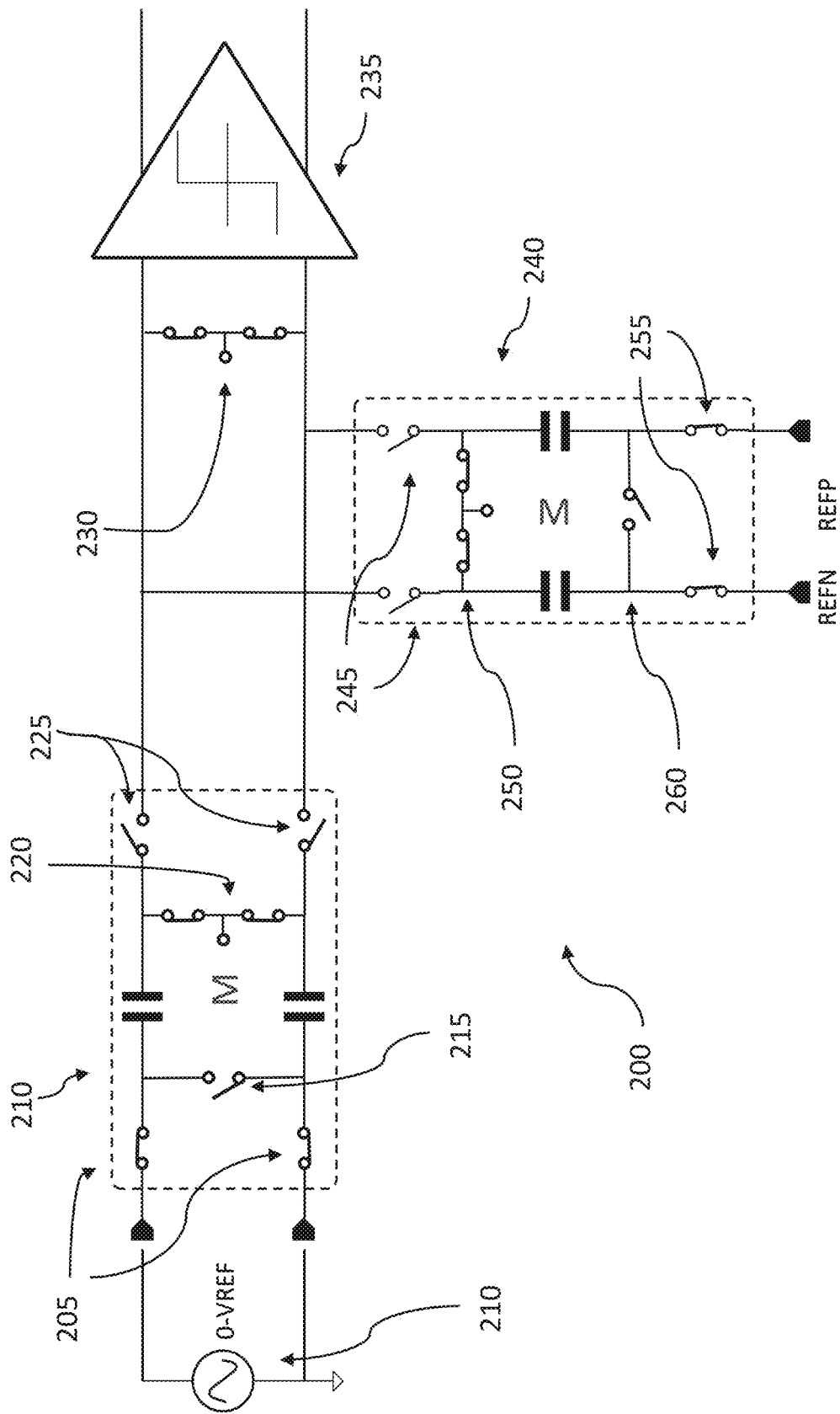

FIGS. 2A-B illustrate exemplary novel successive approximation ADCs, in accordance with some embodiments of the disclosure provided herein. SAR-ADC 200 comprises reference inputs, sample input 210, input cell 210, comparator balance switches 230, comparator 235, and reference cell 240. In one or more embodiments, input cell 210 comprises input charging switches 205, M capacitors, input balance switch 215, input bridging switches 220, and input network switches 225. Reference cell 240 comprises ref charging switches 255, M capacitors, ref balance switch 260, ref bridging switches 250, and ref network switches 245.

As can be appreciated by one skilled in the art, SAR-ADC in FIG. 2A represents an idle or beginning state before acquisition and sampling. In some embodiments, input cells and reference cells, e.g., 210, 240, are abstractions. They represent a collection of capacitors with corresponding switching networks, as necessary. Their capacitive value, collectively, is denoted by their respective notion and is explained as follows. Let's say the unit cap is C. And the resolution of the converter is N bits. The architecture involves splitting the total input and reference sampling capacitor into M equal parts, where $M=2^N$. As one skilled in the art can appreciate, the charge compared at the comparison will different when comparing the same number of reference and input cells unless the input voltage equals the reference voltage.

Turning to FIG. 2B, SAR-ADC 200 comprises reference inputs, sample input 210, input cell 210, comparator balance switches 230, comparator 235, and reference cell 240. In one or more embodiments, input cell 210 comprises input charging switches 205, M capacitors, input balance switch 215, input bridging switches 220, and input network switches 225. Reference cell 240 comprises ref charging switches 255, M capacitors, ref balance switch 260, ref bridging switches 250, and ref network switches 245.

In practice, input charging switches 205, ref charging switches 255, comparator balance switches 230, input bridging switches 220, and reference bridging switches are all closed during the acquisition phase, as depicted in FIG. 2B. This allows the capacitors to charge and nullify any remaining charge which may be present at the electrodes at the comparator 235. The subsequent comparison algorithm will now be discussed in association with following figures.

Figure 3:
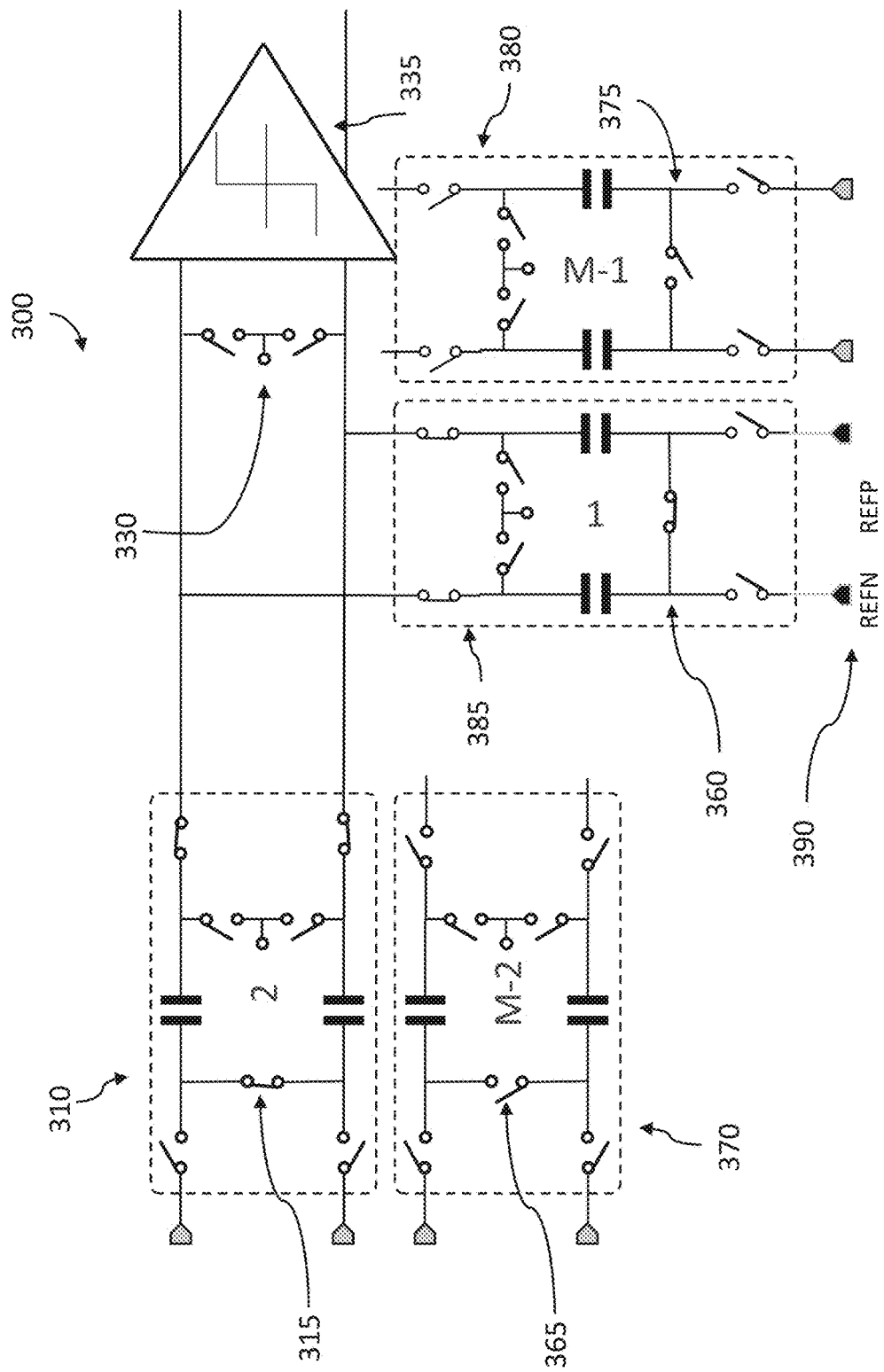
FIG. 3 depicts an exemplary schematic of a successive approximation ADC, in accordance with others embodiments of the disclosure provided herein.

FIG. 3 depicts an exemplary schematic of a successive approximation ADC, in accordance with others embodiments of the disclosure provided herein. SAR-ADC 300 comprises reference inputs 390, input cell 310, comparator balance switches 330, comparator 335, and reference cell 385, input cell 370 and reference cell 380. In one or more embodiments, input cell 310 comprises input charging switches, 2-unit capacitors, input balance switch 315. In some embodiments, reference cell 385 comprises ref charging switches, 1-unit capacitors, ref balance switch 360.

As previously discussed, a 4-bit converter will have N=4 and $M=2^4=16$-unit capacitors. So, in the present embodiment, if the unit cell cap is equal to C, then the total input/reference cap is M*C. In practice, the bit trials begin with none of the reference cells tied to the comparator 335 input and only one input cell 310 tied to comparator 335 input. This is called as the sign bit trial. Based on this result, the manner in which the reference cells be connected will be changed. Thereafter each trial the total number of input cells will be 'doubled' and the number of reference cells connected to the comparator is based on the bit trial results so far.

In one or more embodiments, input cell 370 comprises input charging switches, M−2-unit capacitors, input balance switch 365. In some embodiments, reference cell 380 comprises ref charging switches, M−1-unit capacitors, ref balance switch 375. The circuitry configuration of FIG. 3 represents the first trial after the sign bit trial, i.e., the most significant bit. It is noted that input cell 370 and ref cell 380 do not play a part in the trial and that they are abstractions representing the remain capacitors which are not used in the present trial.

Pursuant to the algorithm, 2 input cells are compared to 1 ref cell. The result of which determines the number of ref cells in the next trial which will now be discussed in greater detail. Input and ref charging switches are open while balance switches 315, 360 are closed. Meanwhile switches from input cell 310 and ref cell 385 permit conductivity to the inputs of comparator 335.

Figure 4:
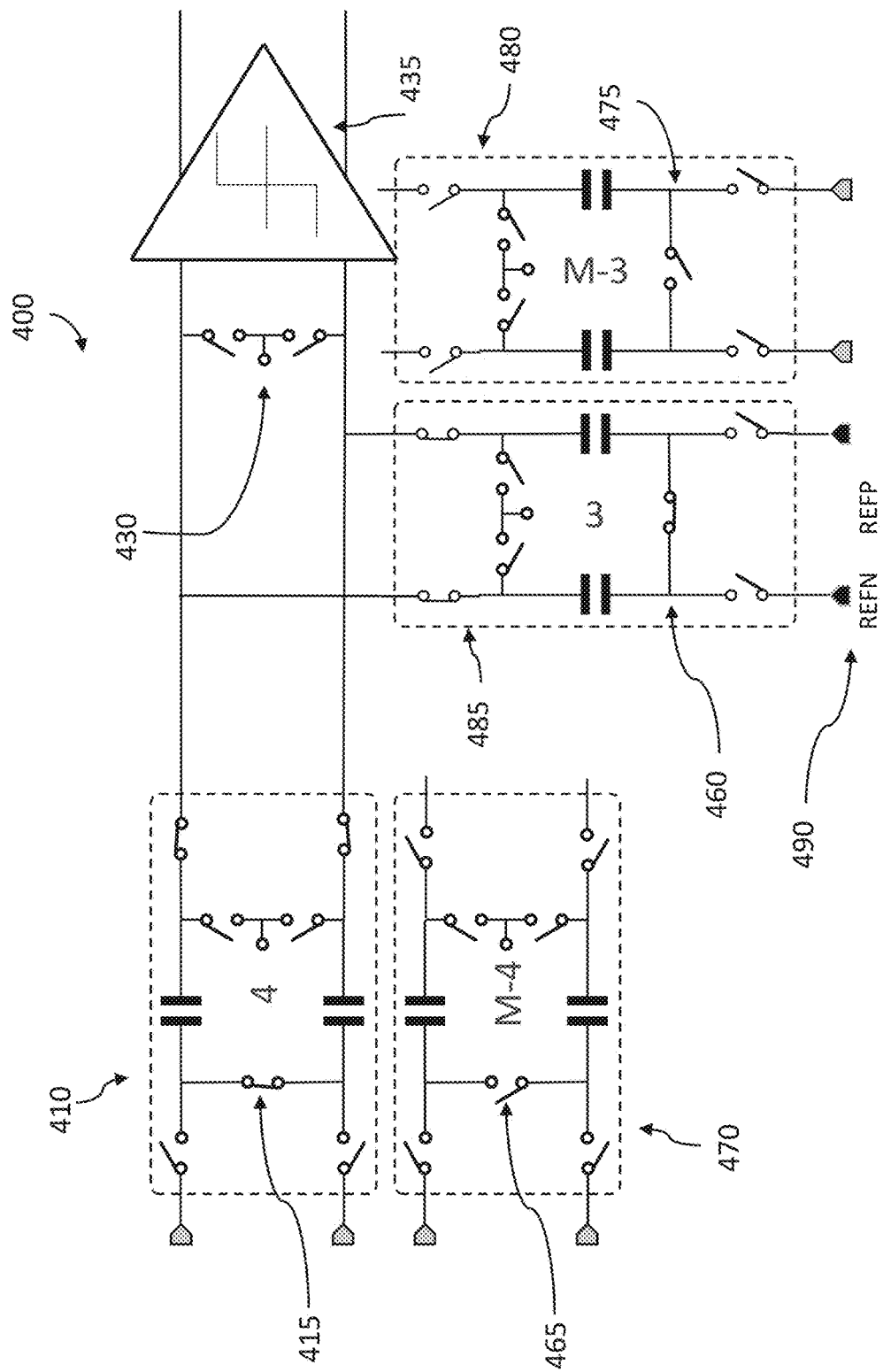
FIG. 4 depicts an exemplary schematic of a successive approximation ADC, in accordance with others embodiments of the disclosure provided herein.

FIG. 4 depicts an exemplary schematic of a successive approximation ADC, in accordance with others embodiments of the disclosure provided herein. SAR-ADC 400 comprises reference inputs 490, input cell 410, comparator balance switches 430, comparator 435, and reference cell 485, input cell 470 and reference cell 480. In one or more embodiments, input cell 410 comprises input charging switches, 4-unit capacitors, input balance switch 415. In some embodiments, reference cell 485 comprises ref charging switches, 3-unit capacitors, ref balance switch 460.

As discussed, each trial the total number of input cells will be doubled and the number of reference cells connected to the comparator is based on the bit trial results so far. So, FIG. 4 shows the second bit trial after sign and MSB trials, therefore the input cap connected to comparator is equal to 1×2×2=4C. And the reference cap is, 2(because MSB trial resulted in 1)+1(current trial)=3C. The capacitors in input cell 470 and ref cell 480 are not yet part of the bit trial circuitry.

In one or more embodiments, input cell 470 comprises input charging switches, M−4-unit capacitors, input balance switch 465. In some embodiments, reference cell 480 comprises ref charging switches, M−3-unit capacitors, ref balance switch 475. The circuitry configuration of FIG. 4 represents the second trial after the sign bit trial, i.e., the second most significant bit. It is noted that input cell 470 and ref cell 480 do not play a part in the trial and that they are abstractions representing the remain capacitors which are not used in the present trial.

Pursuant to the algorithm, 4 input cells are compared to 3 ref cells. The result of which determines the number of ref cells in the next trial which will now be discussed in greater detail. Input and ref charging switches are open while balance switches 415, 460 remain closed. Meanwhile switches from input cell 410 and ref cell 485 permit conductivity to the inputs of comparator 435.

Figure 5:
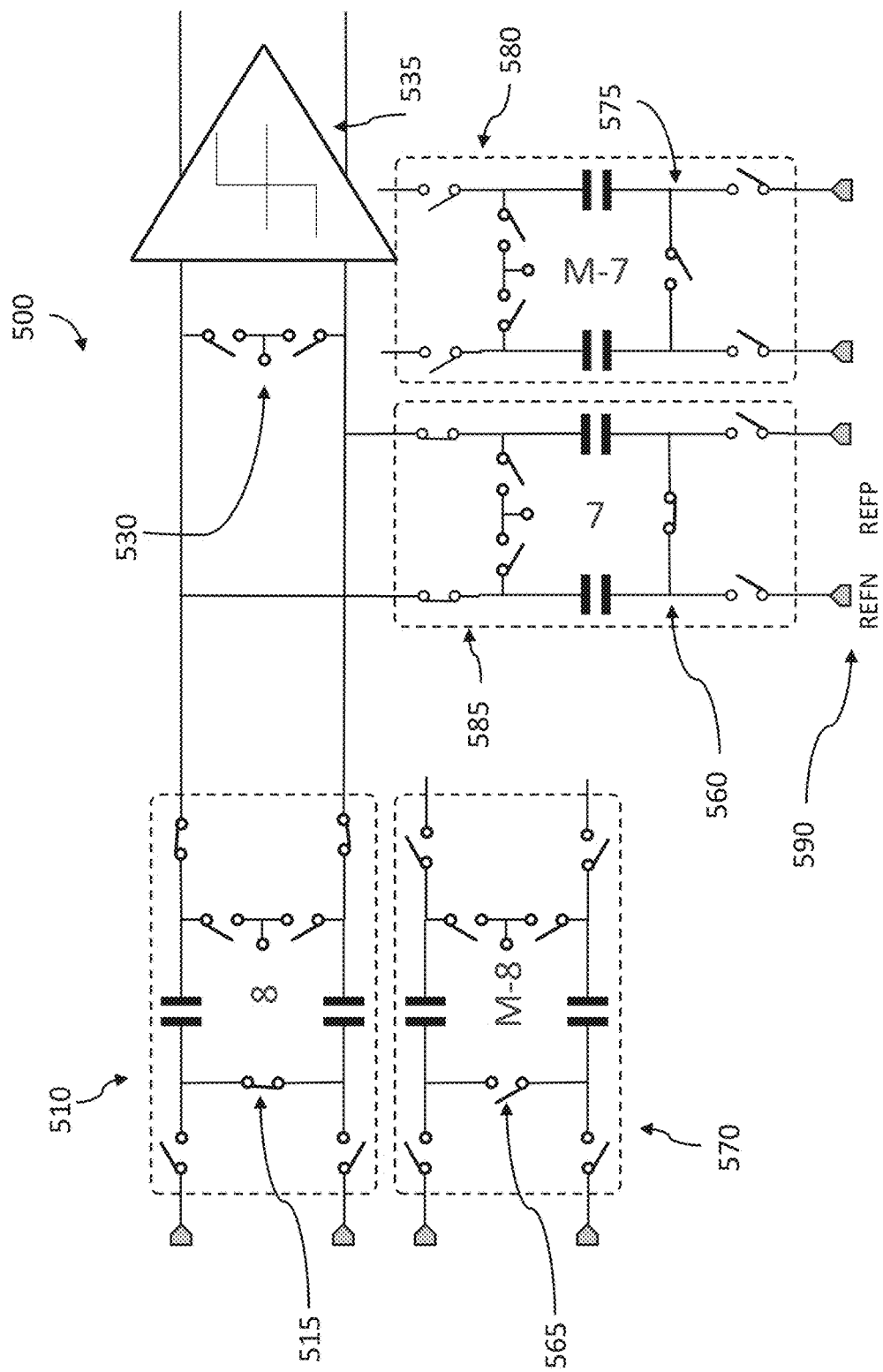
FIG. 5 depicts an exemplary schematic of a successive approximation ADC, in accordance with others embodiments of the disclosure provided herein.

FIG. 5 depicts an exemplary schematic of a successive approximation ADC, in accordance with others embodiments of the disclosure provided herein. SAR-ADC 500 comprises reference inputs 590, input cell 510, comparator balance switches 530, comparator 535, and reference cell 585, input cell 450 and reference cell 580. In one or more embodiments, input cell 510 comprises input charging switches, 8-unit capacitors, input balance switch 515. In some embodiments, reference cell 585 comprises ref charging switches, 7-unit capacitors, ref balance switch 560.

As discussed, each trial the total number of input cells will be doubled and the number of reference cells connected to the comparator is based on the bit trial results so far. So, FIG. 5 shows the third bit trial after sign and MSB trials, therefore the input cap connected to comparator is equal to 1×2×2×2=8C. And the reference cell 585 cap is 7, because MSB trial resulted in 1)+1(previous trial)+1(current trial)=7C. The capacitors in input cell 570 and ref cell 580 are not yet part of the bit trial circuitry.

In one or more embodiments, input cell 570 comprises input charging switches, M–8-unit capacitors, input balance switch 565. In some embodiments, reference cell 580 comprises ref charging switches, M–7-unit capacitors, ref balance switch 575. The circuitry configuration of FIG. 5 represents the third trial after the sign bit trial, i.e., the third most significant bit. It is noted that input cell 570 and ref cell 580 do not play a part in the trial and that they are abstractions representing the remain capacitors which are not used in the present trial.

Pursuant to the algorithm, 8 input cells are compared to 7 ref cells. The result of which determines the number of ref cells in the next trial which will now be discussed in greater detail. Input and ref charging switches are open while balance switches 515, 560 remain closed. Meanwhile switches from input cell 510 and ref cell 585 permit conductivity to the inputs of comparator 535.

Figure 6:
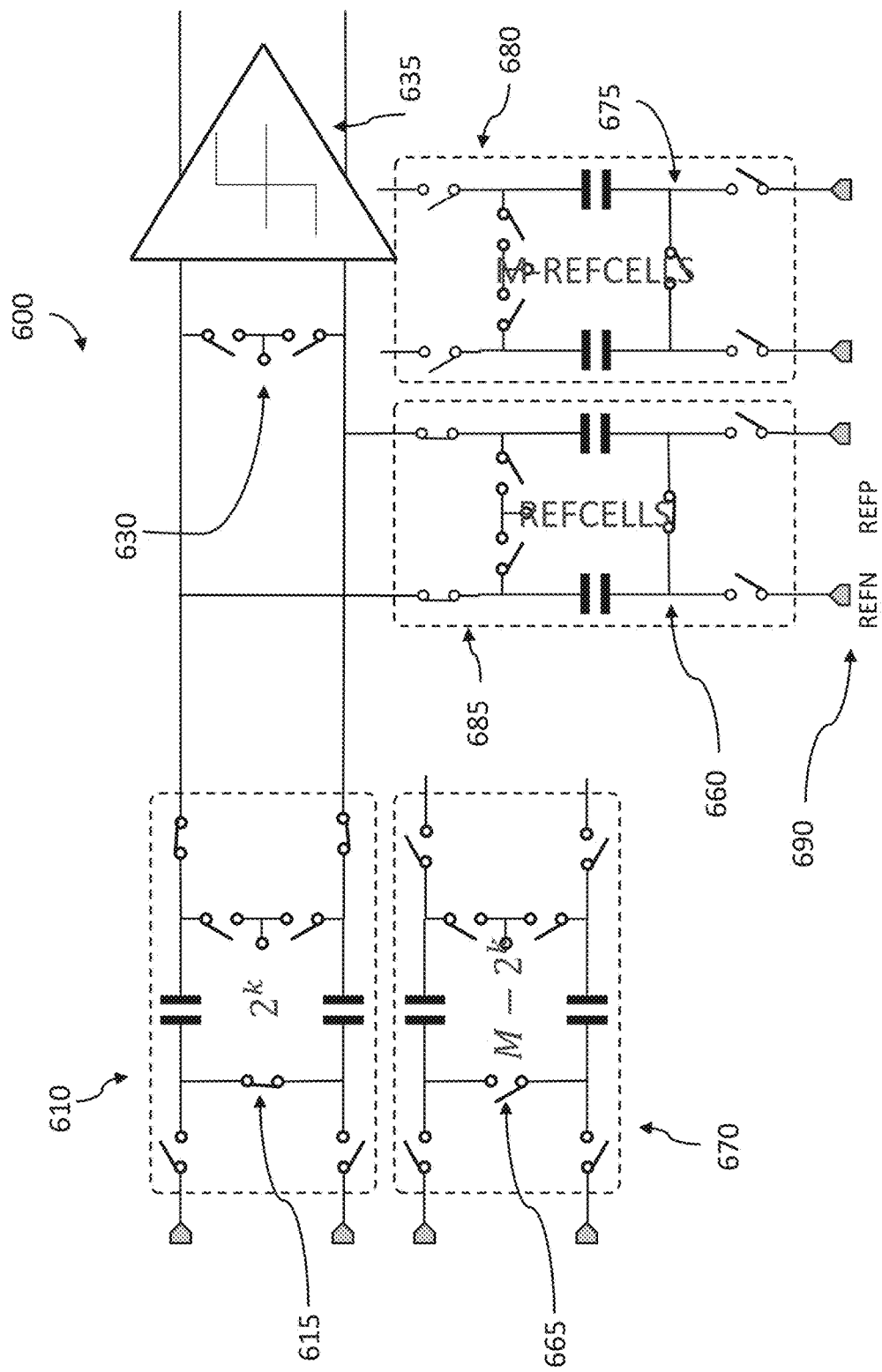
FIG. 6 depicts an exemplary schematic of a successive approximation ADC, in accordance with others embodiments of the disclosure provided herein.

FIG. 6 depicts an exemplary schematic of a successive approximation ADC 600, in accordance with others embodiments of the disclosure provided herein. SAR-ADC 600 comprises reference inputs 690, input cell 610, comparator balance switches 630, comparator 635, and reference cell 685, input cell 650 and reference cell 680. In one or more embodiments, input cell 610 comprises input charging switches, 8-unit capacitors, input balance switch 615. In some embodiments, reference cell 685 comprises ref charging switches, 7-unit capacitors, ref balance switch 660.

FIG. 6 illustrates the generalized implementation of an N-bit ADC where the number of reference cells connected to the comparator input, REFCELLS, after the kth bit trial after sign bit is given by the below equation.

$$REFCELLS = \Sigma_i^k 2_k b_{MSB-i} + 1$$

The circuitry configuration of FIG. 6 represents the k trial after the sign bit trial. It is noted that input cell 670 and ref cell 680 do not play a part in the trial and that they are abstractions representing the remain capacitors which are not used in the present trial.

Pursuant to the algorithm, $2^k$ input cells are compared to ref cells, the number of which is dependent on the previous trials. The result of which determines the number of ref cells in the next trial. Input and ref charging switches are open while balance switches 615, 660 remain closed. Meanwhile switches from input cell 610 and ref cell 685 permit conductivity to the inputs of comparator 635.

The SAR algorithm, without the above-mentioned redundancy, for an N bit A/D conversion can succinctly be described as follows:
Step 1: Sample input and reference quantities [input=INP, reference=REF]
Step 2: Split input and reference to M equal parts. where M=2^N.
set INP_CELL=INP/M, set REF_CELL=REF/M,
set output array b [1: N]=0; i=1; X=0; Y=0.
Step 3: set b[i]=1; X=(2^i); Y=1+Σ{b[i]. (2^i)} for i=1 to N
Step 4: if (X.INP_CELL>=Y.REF_CELL) then b[i]=1 else b[i]=0.
Step 5: if (i>=N) goto Step 6. else i=(i+1) and goto Step 3.
Step 6: Stop. b [1: N] gives the digital output.

Figure 7:
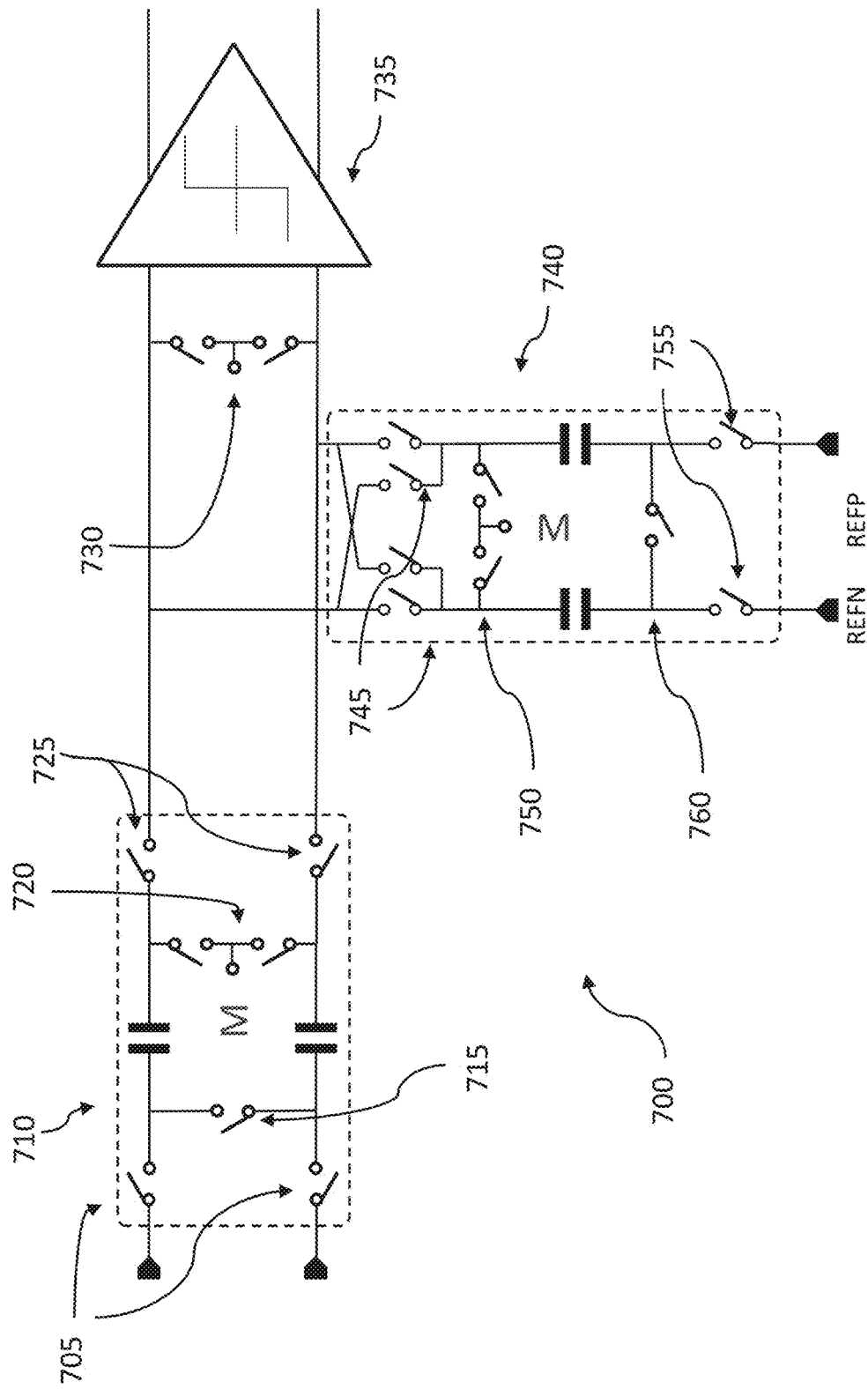
FIG. 7 depicts an exemplary schematic of a successive approximation ADC, in accordance with others embodiments of the disclosure provided herein.

FIG. 7 illustrate an exemplary novel successive approximation ADC operating in differential mode, in accordance with some embodiments of the disclosure provided herein. SAR-ADC 700 comprises reference inputs, sample input 710, input cell 710, comparator balance switches 730, comparator 735, and reference cell 740. In one or more embodiments, input cell 710 comprises input charging switches 705, M capacitors, input balance switch 715, input bridging switches 720, and input network switches 725. Reference cell 740 comprises ref charging switches 755, M capacitors, ref balance switch 760, ref bridging switches 750, ref network switches 745, and ref differential switches 745.

As can be appreciated by one skilled in the art, SAR-ADC in FIG. 7 represents an idle or beginning state before acquisition and sampling. In some embodiments, input cells and reference cells, e.g., 710, 740, are abstractions. They represent a collection of capacitors with corresponding switching networks, as necessary. Their capacitive value, collectively, is denoted by their respective notion and is explained as follows. Let's say the unit cap is C. And the resolution of the converter is N bits. The architecture involves splitting the total input and reference sampling capacitor into M equal parts, where M=2^N. As one skilled in the art can appreciate, the charge compared at the comparison will different when comparing the same number of reference and input cells unless the input voltage equals the reference voltage.

In one or more embodiments, ref differential switches are used to cancel existing charge and/or negating voltage potential on the inputs to comparator 735. As one skilled in the art can appreciate, an object is to reduce comparator swings. Each trial iteration not only identifies the next significant bit but to strives to mitigate the charge differential. To this end, inputs 810 opposite polarities can be observed in FIG. 8.

Figure 8:
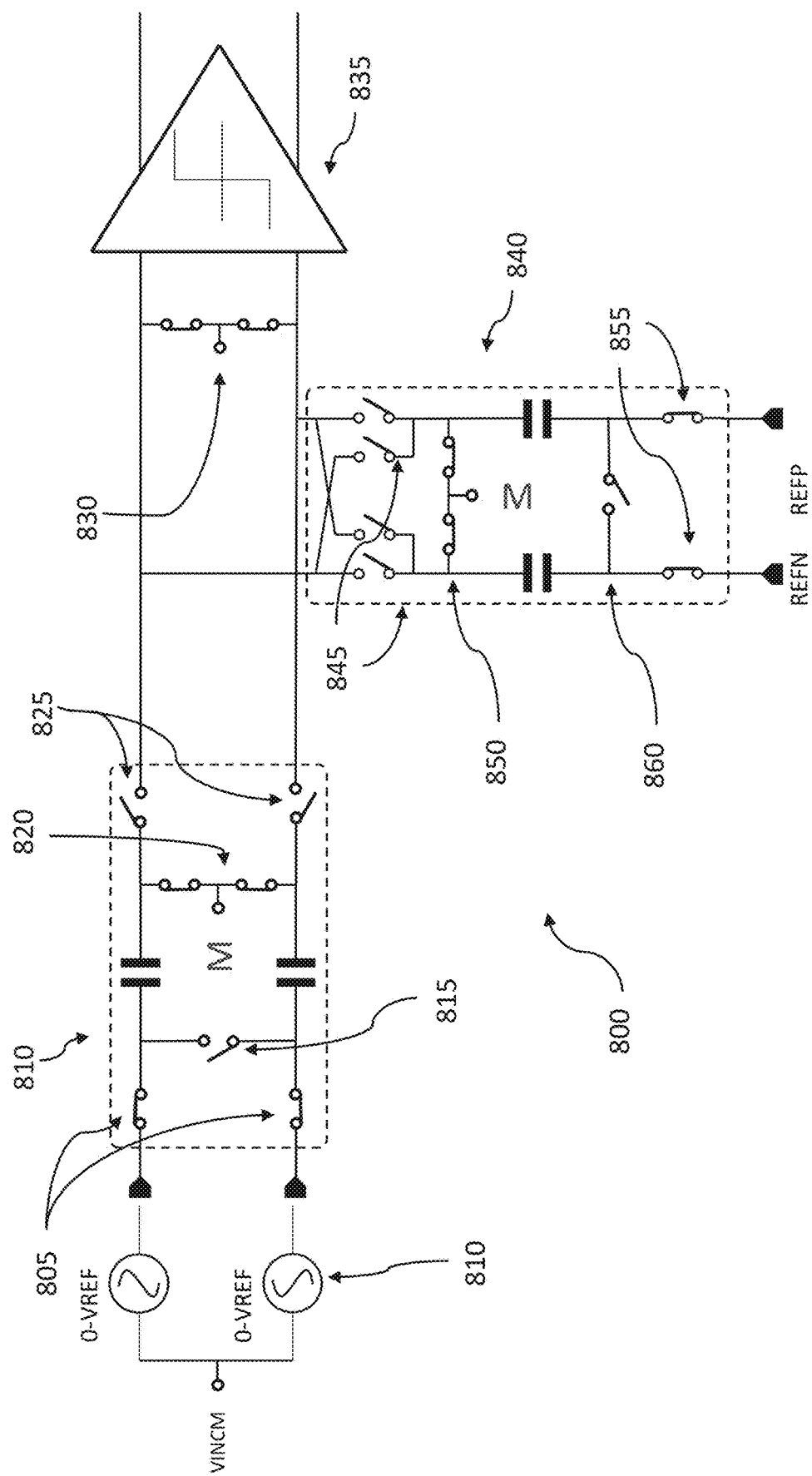
FIG. 8 depicts an exemplary schematic of a successive approximation ADC, in accordance with others embodiments of the disclosure provided herein.

FIG. 8 illustrate an exemplary novel successive approximation ADC operating in differential mode, in accordance with some embodiments of the disclosure provided herein. SAR-ADC 800 comprises reference inputs, sample input 810, input cell 810, comparator balance switches 830, comparator 835, and reference cell 840. In one or more embodiments, input cell 810 comprises input charging switches 805, M capacitors, input balance switch 815, input bridging switches 820, and input network switches 825. Reference cell 840 comprises ref charging switches 855, M capacitors, ref balance switch 860, ref bridging switches 850, ref network switches 845, and ref differential switches 845.

In practice, input charging switches 805, ref charging switches 855, comparator balance switches 830, input bridging switches 820, and reference bridging switches are all closed during the acquisition phase, as depicted in FIG. 8.

This allows the capacitors to charge and nullify any remaining charge which may be present at the electrodes at the comparator 835. The subsequent comparison algorithm will now be discussed in association with following figures.

The present embodiments eliminate the need for large attenuation caps needed to reduce voltage swings at comparator inputs. The results in a comparator noise gain of 1+REFCELLS/M which increase linearly with input. For example, the comparative noise gain is ~1 for inputs near zero swing and ~2 for inputs near full swing. In contrast, the comparative noise gain is 1+M−1/M for a more traditional SAR ADC.

Figure 9:
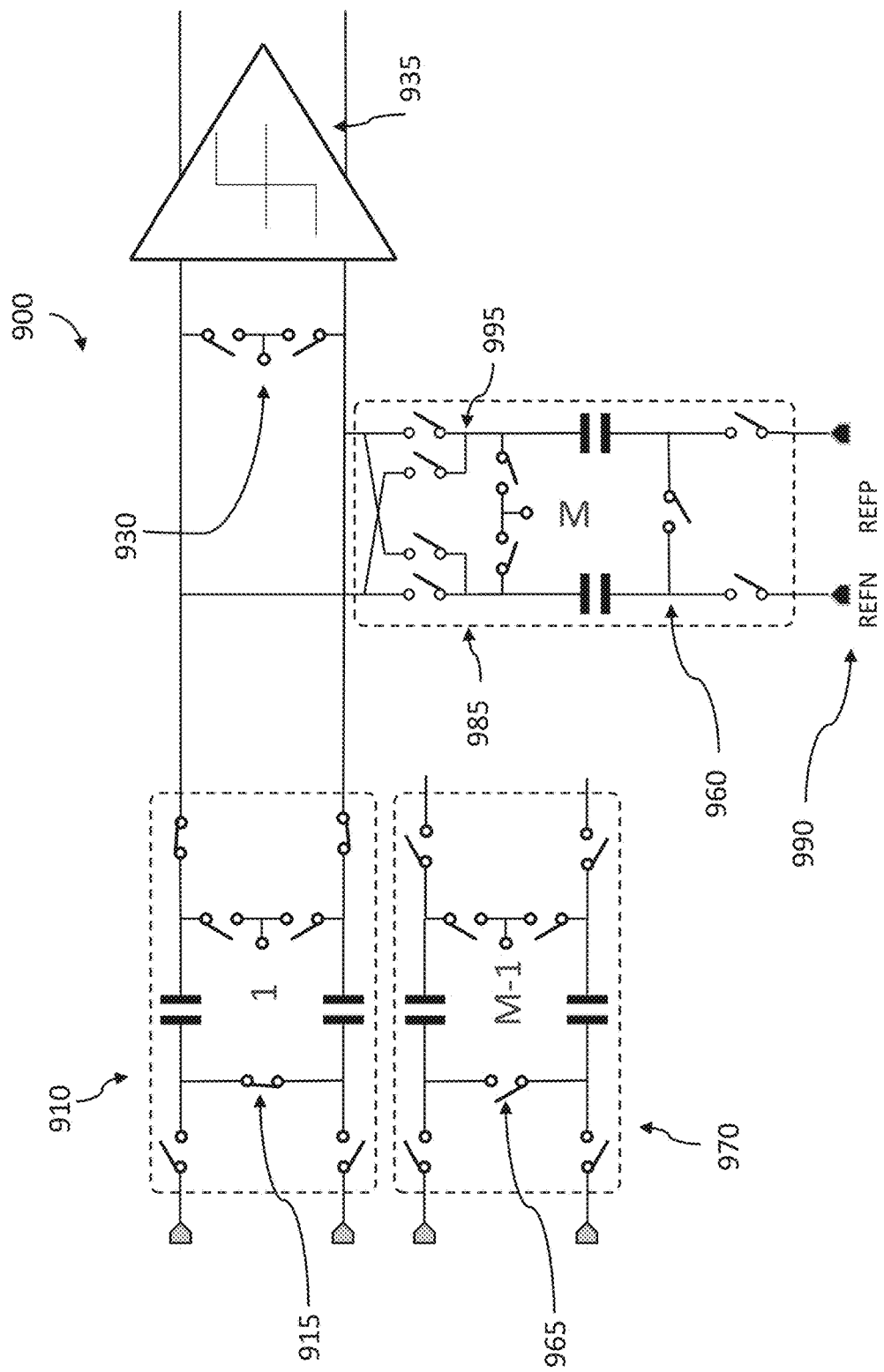
FIG. 9 depicts an exemplary schematic of a successive approximation ADC, in accordance with others embodiments of the disclosure provided herein.

FIG. 9 depicts an exemplary schematic of a successive approximation ADC in differential mode, in accordance with others embodiments of the disclosure provided herein. SAR-ADC 900 comprises reference inputs 990, input cell 910, comparator balance switches 930, comparator 935, and reference cell 985, input cell 970 and reference cell 980. In one or more embodiments, input cell 910 comprises input charging switches, 1-unit capacitors, input balance switch 915. In some embodiments, reference cell 985 comprises ref charging switches, M unit capacitors, ref balance switch 960, and ref differential switches 995.

As previously discussed, a 4-bit converter will have N=4 and M=2^4=16-unit capacitors. So, in the present embodiment, if the unit cell cap is equal to C, then the total input/reference cap is M*C. In practice, the bit trials begin with none of the reference cells tied to the comparator 935 input and only one input cell 910 tied to comparator 935 input. This is called as the sign bit trial. Based on this result, the manner in which the reference cells be connected will be changed. Thereafter each trial the total number of input cells will be 'doubled' and the number of reference cells connected to the comparator is based on the bit trial results so far.

In one or more embodiments, input cell 970 comprises input charging switches, M−1-unit capacitors, input balance switch 965. In some embodiments, reference cell 985 comprises ref charging switches, M unit capacitors, ref balance switch 960. The circuitry configuration of FIG. 9 represents the sign bit trial. As stated, the first trial is just to check polarity on the input. It is noted that input cell 970 and ref cell 985 do not play a part in the trial and that they are abstractions representing the remain capacitors which are not used in the present trial.

Figure 10:
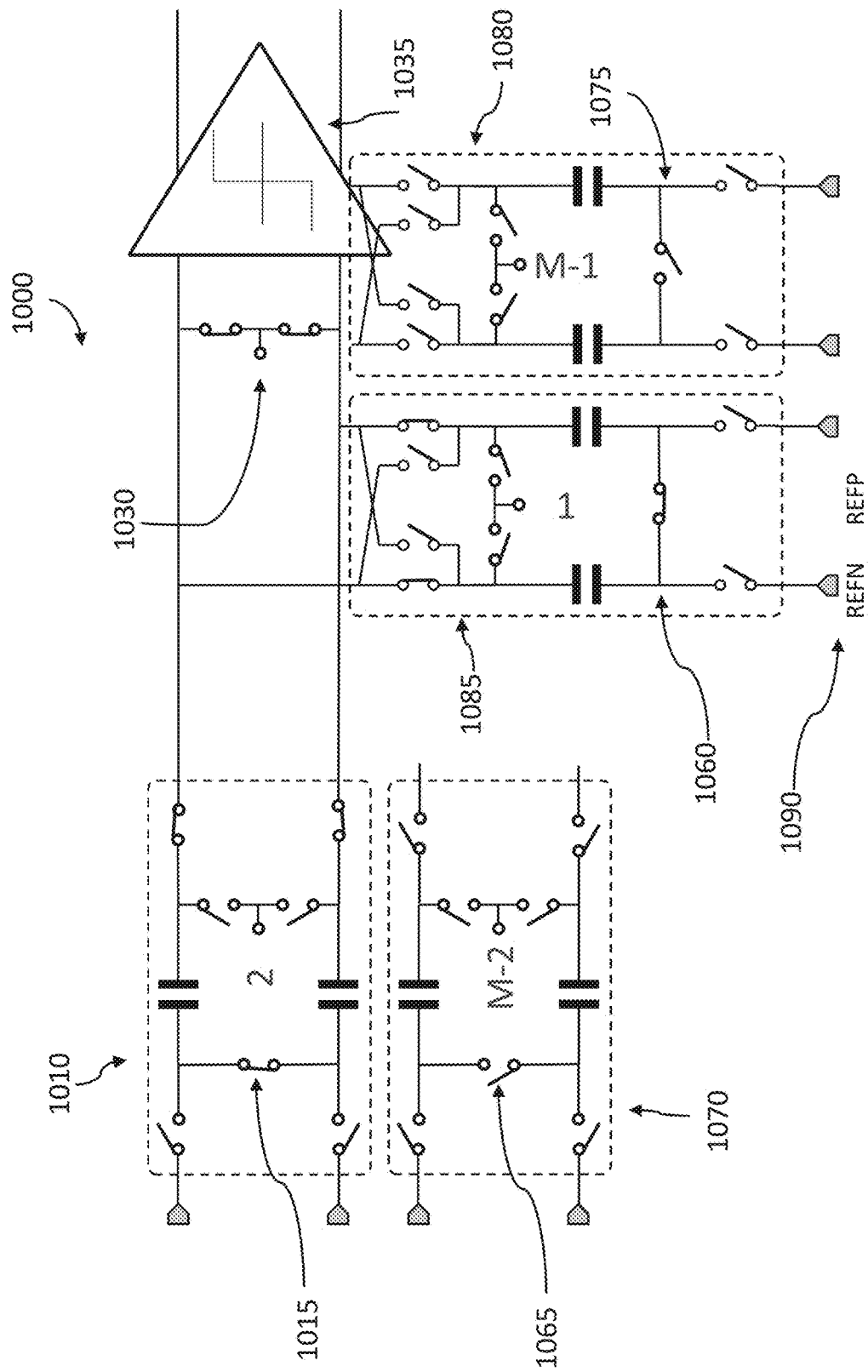
FIG. 10 depicts an exemplary schematic of a successive approximation ADC, in accordance with others embodiments of the disclosure provided herein.

FIG. 10 depicts an exemplary schematic of a successive approximation ADC in differential mode, in accordance with others embodiments of the disclosure provided herein. SAR-ADC 1000 comprises reference inputs 1090, input cell 1010, comparator balance switches 1030, comparator 1035, and reference cell 1085, input cell 1070 and reference cell 1080. In one or more embodiments, input cell 1010 comprises input charging switches, 2-unit capacitors, input balance switch 1015. In some embodiments, reference cell 1085 comprises ref charging switches, 1-unit capacitors, ref balance switch 1060, and differential switches.

As discussed, each trial the total number of input cells will be doubled and the number of reference cells connected to the comparator is based on the bit trial results so far. So, FIG. 10 shows the first bit trial (MSB) after sign trial. Accordingly, the input cell 1010 connected to comparator is equal to 1×2=2C. And the reference cap is 1C. The capacitors in input cell 1070 and ref cell 1080 are not yet part of the bit trial circuitry.

In one or more embodiments, input cell 1070 comprises input charging switches, M−2-unit capacitors, input balance switch 1065. In some embodiments, reference cell 1080 comprises ref charging switches, M−1-unit capacitors, ref balance switch 1075. The circuitry configuration of FIG. 10 represents the first trial after the sign bit trial, i.e., the most significant bit.

Pursuant to the algorithm, 2 input cells are compared to 1 ref cell. The result of which determines the number of ref cells in the next trial, as previously described. Input and ref charging switches are open while balance switches 1015, 1060 remain closed. Meanwhile switches from input cell 1010 and ref cell 1085 permit conductivity to the inputs of comparator 435.

Figure 11:
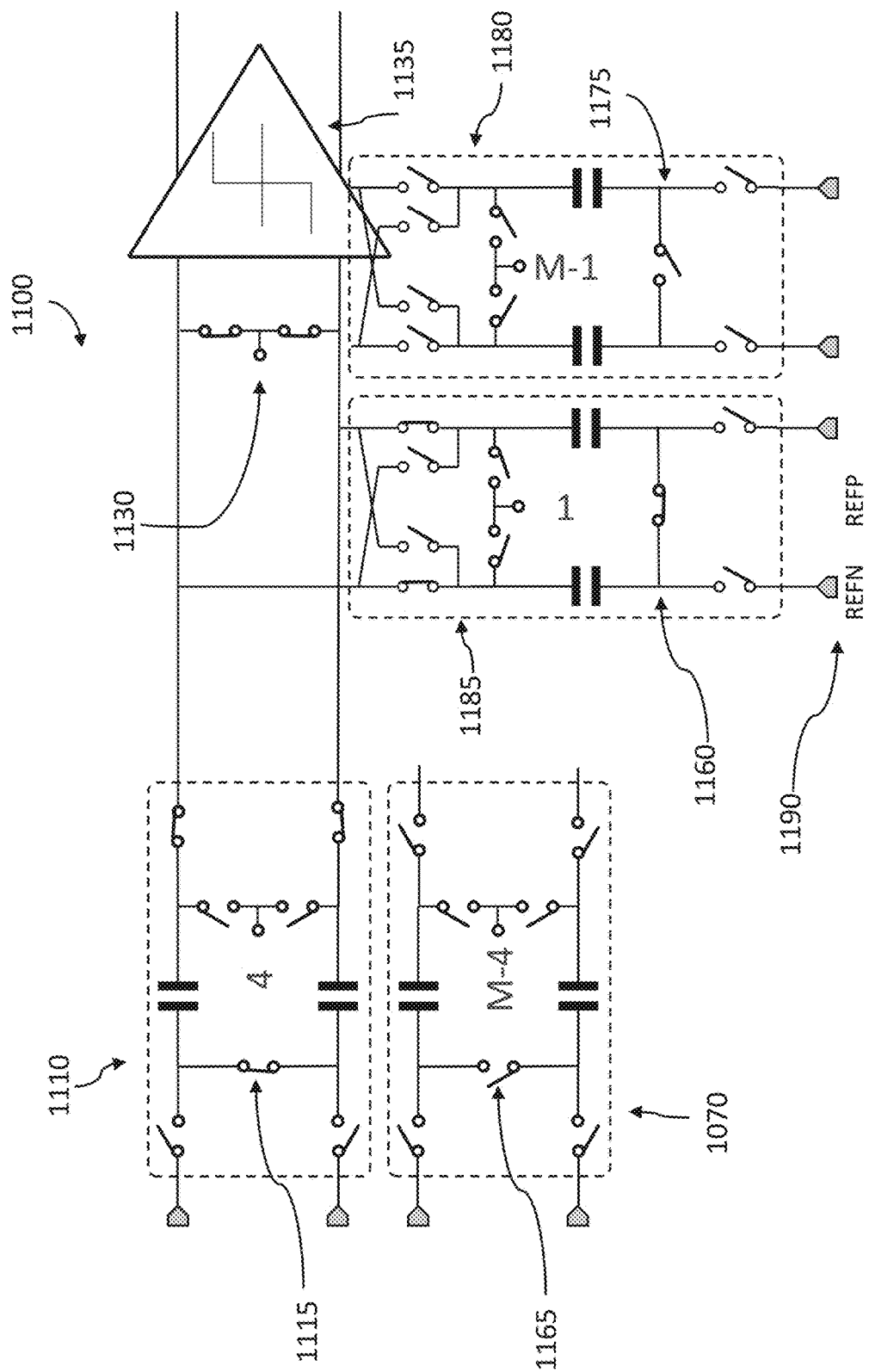
FIG. 11 depicts an exemplary schematic of a successive approximation ADC, in accordance with others embodiments of the disclosure provided herein.

FIG. 11 depicts an exemplary schematic of a successive approximation ADC in differential mode, in accordance with others embodiments of the disclosure provided herein. SAR-ADC 1100 comprises reference inputs 1190, input cell 1110, comparator balance switches 1130, comparator 1135, and reference cell 1185, input cell 1150 and reference cell 1180. In one or more embodiments, input cell 1110 comprises input charging switches, 4-unit capacitors, input balance switch 1115. In some embodiments, reference cell 1185 comprises ref charging switches, 1-unit capacitors, ref balance switch 1160.

As discussed, each trial the total number of input cells will be doubled and the number of reference cells connected to the comparator is based on the bit trial results so far. So, FIG. 11 shows the third bit trial after sign and MSB trials, therefore the input cap connected to comparator is equal to 1×2×2×2=8C. And the reference cell 585 cap is 1, because MSB trial resulted in 0)+0(previous trial)+1(current trial)= 1C. The capacitors in input cell 1170 and ref cell 1180 are not yet part of the bit trial circuitry.

In one or more embodiments, input cell 1170 comprises input charging switches, M−4-unit capacitors, input balance switch 1165. In some embodiments, reference cell 1180 comprises ref charging switches, M−1-unit capacitors, ref balance switch 575. The circuitry configuration of FIG. 11 represents the second trial after the sign bit trial, i.e., the second most significant bit. Pursuant to the algorithm, 4 input cells are compared to 1 ref cell. The result of which determines the number of ref cells in the next trial. Input and ref charging switches are open while balance switches 1115, 1160 remain closed. Meanwhile switches from input cell 1110 and ref cell 1185 permit conductivity to the inputs of comparator 1135.

Figure 12:
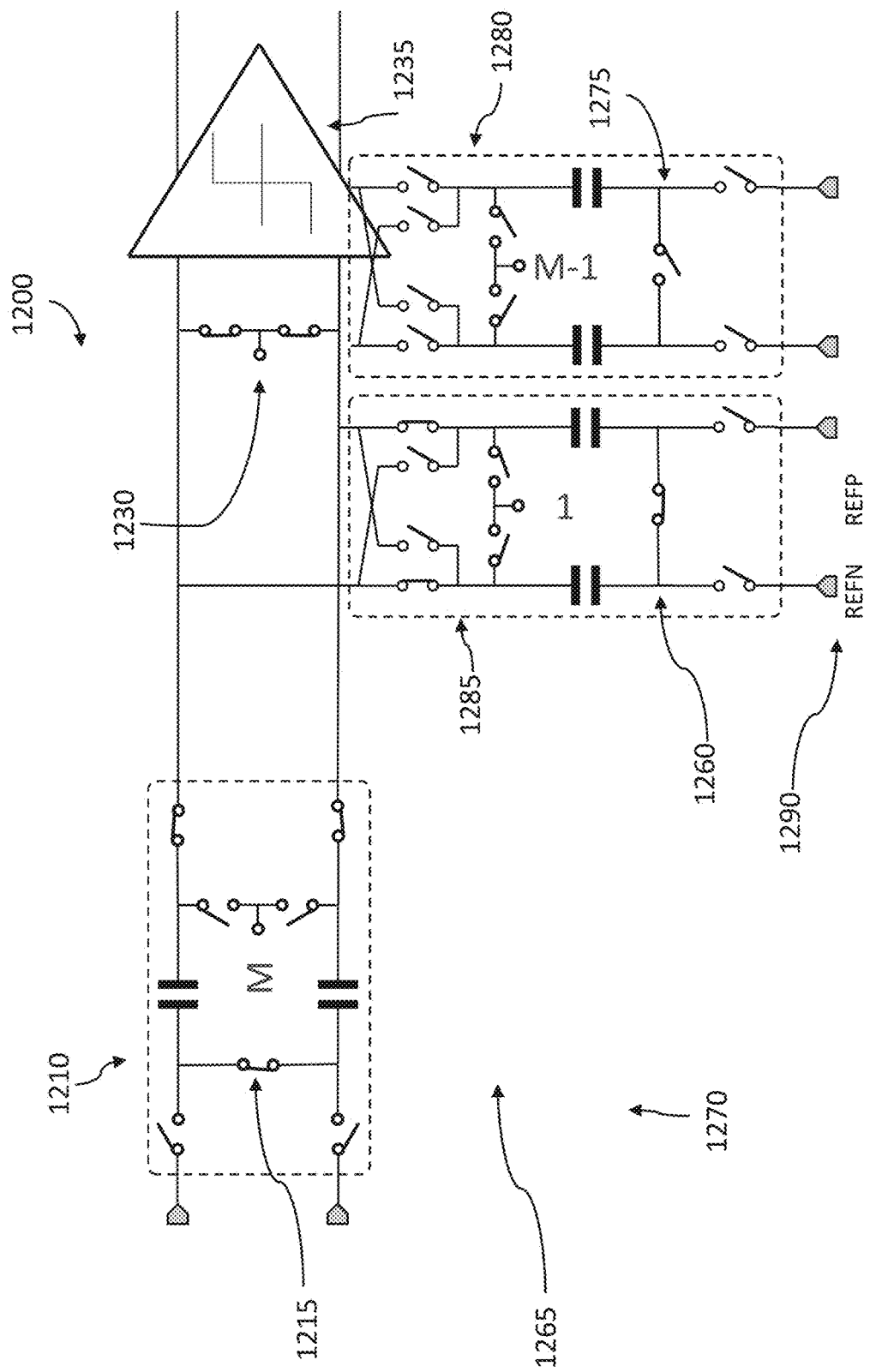
FIG. 12 depicts an exemplary schematic of a successive approximation ADC, in accordance with others embodiments of the disclosure provided herein.

FIG. 12 depicts an exemplary schematic of a successive approximation ADC 600 in differential mode, in accordance with others embodiments of the disclosure provided herein. SAR-ADC 1200 comprises reference inputs 1290, input cell 1210, comparator balance switches 1230, comparator 1235, and reference cell 1285, input cell 1250 and reference cell 1280. In one or more embodiments, input cell 1210 comprises input charging switches, M unit capacitors, input balance switch 1215. In some embodiments, reference cell 1285 comprises ref charging switches, 1-unit capacitors, ref balance switch 1260.

The circuitry configuration of FIG. 12 represents the least significant bit (LSB) trial. In the present example, it is noted that the previous trials resulted in 0. That is, MSB-2 Trial, MSB, MSB-1=0. Pursuant to the algorithm, all M input cells are compared to 1 ref cells, the number of which is dependent on the previous trials. Input and ref charging switches are open while balance switches 1215, 1260 remain closed. Meanwhile switches from input cell 1210 and ref cell 1285 permit conductivity to the inputs of comparator 1235. It is noted that M−1-unit capacitors of ref cell 1280 remain unused in the trials.

Figure 13:
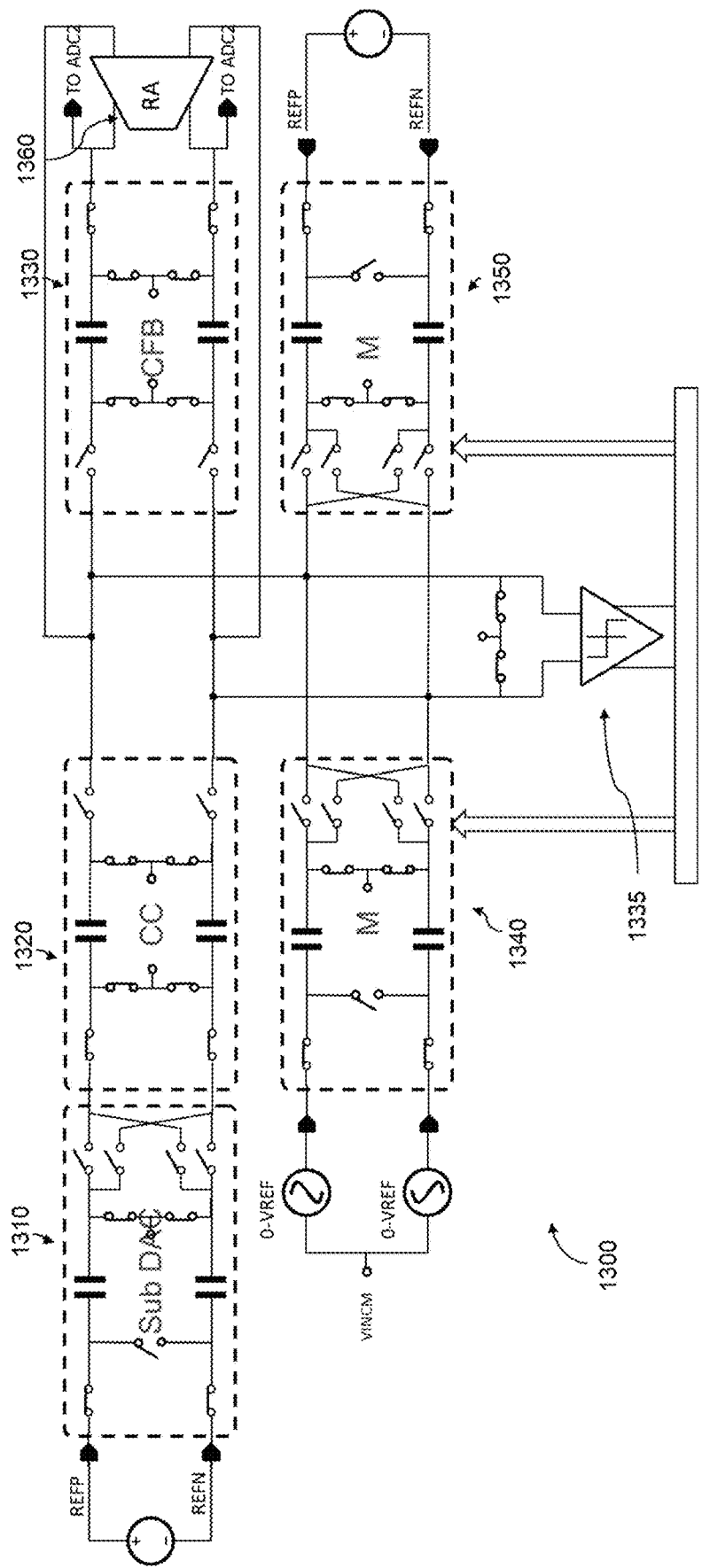
FIG. 13 depicts an exemplary schematic of a successive approximation ADC, in accordance with others embodiments of the disclosure provided herein.

FIG. 13 depicts an exemplary schematic of a successive approximation ADC 1300, in accordance with others embodiments of the disclosure provided herein. In some embodiments, SAR ADC 1300 integrates existing elements, such as, Sub DAC 1310 which may use similar switching scheme as described for main DAC 1340 and 1350 earlier, CC capacitor bank 1320, feedback capacitors (CFB) 1330, and residue amplifier (RA) 1360 1360 into its architecture. Nominally, the present disclosure obviates these elements, as one skilled in the art can appreciate. However, the present embodiment exemplifies the present disclosures versatility into existing architectures while still retaining many benefits. Specifically, top and bottom plate blocks 1340, 1350 are in electrical communication with comparator 1335, RA 1360, and disposed between CC 1320 and CFB 1320.

In several embodiments, top plate capacitor attenuation is dependent on output code. All previous architectures give 6 dB signal loss at dac top plate node for input sampling capacitor equal to reference sampling capacitor or 2× noise gain for comparator/RA at ADC input, in contrast to the present architectures. For the present architecture, the noise gain scales with input from 1 (normal) to 2 as input goes from 0 to full-scale. The present disclosure provides for lower cap attenuation for smaller inputs. That is, smaller Inputs gets lower Noise Gain→High Dynamic Range. Another advantage is that the architecture is symmetric and Interchangeable INP and REF paths.

This enables redundancy to be applied only when it is needed as well. In traditional SAR implementations the redundant capacitors need to be proportionately large as the redundancy range that it provides and this redundant capacitor is present at the comparator input irrespective of whether there is a settling error or not. Adding capacitors to the comparator input which are not sampling the analog input acts as attenuation capacitors that reduces the signal swing and therefore the signal to noise ratio of the ADC. The new SAR algorithm enables an efficient use of redundancy that is added only when needed and the magnitude of redundancy capacitor is independent of the redundancy range that it provides.

Select Examples

Example 1 provides a method for performing SAR DAC comparison in a SAR ADC comprising dividing an input signal into a plurality of a predetermined number of input cells dividing a reference signal into a plurality of the predetermined number of reference cells, and adding $2^{N-1}$ input cells to an input sum adding $2^N$ reference cells to a reference sum, comparing the input sum to the reference sum.

Example 2 provides a method for performing SAR DAC comparison in a SAR ADC according to any of the preceding and/or proceeding examples, and if the input sum is less than the reference sum, subtracting the 2N reference cells from the reference sum.

Example 3 provides a method for performing SAR DAC comparison in a SAR ADC according to any of the preceding and/or proceeding examples further comprising incrementing N.

Example 4 provides a method for performing SAR DAC comparison in a SAR ADC according to any of the preceding and/or proceeding examples further comprising iterating through N until 2N−1 equals or exceeds the predetermined number of input cells.

Example 5 provides a method for performing SAR DAC comparison in a SAR ADC according to any of the preceding and/or proceeding examples, wherein N is a normal number.

Example 6 provides a method for performing SAR DAC comparison in a SAR ADC according to any of the preceding and/or proceeding examples, wherein N in as integer beginning with 1.

Example 7 provides a method for performing SAR DAC comparison in a SAR ADC according to any of the preceding and/or proceeding examples, wherein the input signal represents a voltage.

Example 8 provides a method for performing SAR DAC comparison in a SAR ADC according to any of the preceding and/or proceeding examples, wherein the input signal represents a charge.

Example 9 provides a method for performing SAR DAC comparison in a SAR ADC according to any of the preceding and/or proceeding examples, wherein the reference signal represents a voltage.

Example 10 provides a method for performing SAR DAC comparison in a SAR ADC according to any of the preceding and/or proceeding examples, wherein the reference signal represents a charge.

Example 11 provides a method for performing SAR DAC comparison in a SAR ADC according to any of the preceding and/or proceeding examples, wherein reference sum is an input to a comparator.

Example 12 provides a method for performing SAR DAC comparison in a SAR ADC according to any of the preceding and/or proceeding examples, wherein input sum is an input to a comparator.

Example 13 provides a method for performing SAR DAC comparison in a SAR ADC according to any of the preceding and/or proceeding examples further comprising producing a binary result from the comparison.

Example 14 provides a method for performing SAR DAC comparison in a SAR ADC according to any of the preceding and/or proceeding examples further comprising producing an N-bit number resulting from the comparison.

Example 15 provides a method for performing SAR DAC comparison in a SAR ADC according to any of the preceding and/or proceeding examples, wherein the N-bit number represents a digital sample of the input signal.

Example 16 provides a method for performing SAR DAC comparison in a SAR ADC according to any of the preceding and/or proceeding examples, wherein the input cells are divided equally.

Example 17 provides a method for performing SAR DAC comparison in a SAR ADC according to any of the preceding and/or proceeding examples, wherein the reference cells are divided equally.

Example 18 provides for a SAR DAC in a SAR ADC comprising a plurality of input capacitors configured to equally divide an input signal, a plurality of reference capacitors configured to equally divide a reference signal, and a comparator having a reference lead and input lead.

Example 19 provides a SAR DAC in a SAR ADC according to any of the preceding and/or proceeding examples further comprising a controller configured to electrically connect $2^{N-1}$ input capacitors to the input lead, electrically connect $2^N$ reference capacitors to the reference lead, evaluate a comparison of the input lead to the reference lead, increment N, if the input lead is less than the reference lead, disconnect the $2^N$ reference capacitor from the reference lead; and iterate through N until $2^{N-1}$ equals or exceeds the number of input capacitors.

Example 20 provides a SAR DAC in a SAR ADC according to any of the preceding and/or proceeding examples, wherein the input signal represents at least one of a voltage, current, and charge.

Example 21 provides a SAR DAC in a SAR ADC according to any of the preceding and/or proceeding examples, wherein the reference signal represents at least one of a voltage, current, and charge.

Example 22 provides a SAR DAC in a SAR ADC according to any of the preceding and/or proceeding examples, wherein the controller is configured to produce an N-bit number resulting from the comparison.

Example 23 provides a SAR DAC in a SAR ADC according to any of the preceding and/or proceeding examples, wherein the N-bit number represents a digital sample of the input signal.

Example 24 provides for an apparatus for performing SAR DAC comparison in a SAR ADC comprising a means for dividing an input signal into a plurality of a predetermined number of input cells, a means for dividing a reference signal into a plurality of the predetermined number of reference cells, a means for adding 2N−1 input cells to an input sum, a means for adding 2N reference cells to a reference sum, a means for comparing the input sum to the reference sum and if the input sum is less than the reference sum, subtracting the 2N reference cells from the reference sum, a means for incrementing N, and a means for iterating through N until 2N−1 equals or exceeds the predetermined number of input cells.

Numerous specific details have been set forth herein to provide a thorough understanding of the embodiments. It will be understood by those skilled in the art, however, that the embodiments may be practiced without these specific details. In other instances, well-known operations, components, and circuits have not been described in detail so as not to obscure the embodiments. It can be appreciated that the specific structural and functional details disclosed herein may be representative and do not necessarily limit the scope of the embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

Note that the activities discussed above with reference to the FIGURES which are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe.

Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments.

The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc.

Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure.

In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Interpretation of Terms

All definitions, as defined and used herein, should be understood to control over dictionary definitions, definitions in documents incorporated by reference, and/or ordinary meanings of the defined terms. Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to."

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a," "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

What is claimed is:

1. A SAR DAC in a SAR ADC comprising:
   a plurality of input capacitors configured to divide an input signal;
   a plurality of reference capacitors configured to divide a reference signal;
   a comparator having a reference lead and input lead; and
   a controller configured to:
      electrically connect $2^{N-1}$ input capacitors to the input lead;
      electrically connect $2^N$ reference capacitors to the reference lead;
      evaluate a comparison of the input lead to the reference lead;
      increment N;
      if the input lead is less than the reference lead, disconnect the $2^N$ reference capacitor from the reference lead; and
      iterate through N until $2^{N-1}$ equals or exceeds the number of input capacitors.

2. The SAR DAC according to claim 1, wherein the input signal represents at least one of a voltage, current, and charge.

3. The SAR DAC according to claim 1, wherein the reference signal represents at least one of a voltage, current, and charge.

4. The SAR DAC according to claim 1, wherein the controller is configured to produce an N-bit number resulting from the comparison.

5. The SAR DAC according to claim 4, wherein the N-bit number represents a digital sample of the input signal.

6. The SAR DAC according to claim 1 further comprising a negative input signal.

7. The SAR DAC according to claim 6, wherein the second input signal has the opposite polarity as the input signal.

8. The SAR DAC according to claim 7 further comprising a negative reference signal.

9. The SAR DAC according to claim 8, wherein the second input signal has the opposite polarity as the input signal.

10. The SAR DAC according to claim 1 further comprising differential switches.

11. The SAR DAC according to claim 10 wherein differential switches are configured to cancel out voltage or charge on the reference lead of the comparator.

12. The SAR DAC according to claim 10 wherein differential switches are configured to cancel out voltage or charge on the input lead of the comparator.

13. A SAR DAC in a SAR ADC comprising:
   a plurality of input capacitors configured to equally divide an input signal;
   a plurality of reference capacitors configured to equally divide a reference signal; and
   a circuit configured to:
      compare signals on $2^{N-1}$ input capacitors to signals on $2^N$ reference capacitors;
      increment N; and
      if the signals on $2^{N-1}$ input capacitors are less than the signals on $2^N$ reference capacitors, disconnect the $2^N$ reference capacitor.

14. The SAR DAC according to claim 13, wherein the circuit is further configured to iterate through N until $2^{N-1}$ equals or exceeds the number of input capacitors.

15. The SAR DAC according to claim 13, wherein at least one of the signals are quantified by voltage.

16. The SAR DAC according to claim 13, wherein at least one of the signals are quantified by charge.

17. The SAR DAC according to claim 13, wherein the circuit comprises a comparator to perform the comparison.

18. A SAR DAC in a SAR ADC comprising:
   a sub-DAC;
   a residual amplifier;
   a comparator;
   an input block comprising a predetermined number of input capacitors configured to equally divide an input signal;
   a reference block comprising a predetermined number of reference capacitors configured to equally divide a reference signal; and
   switching fabric configured to compare signals on $2^{N-1}$ input capacitors to signals on $2^N$ reference capacitors at the comparator.

19. The SAR DAC according to claim 18, wherein the input signal represents at least one of a voltage, current, and charge.

20. The SAR DAC according to claim 18, wherein the reference signal represents at least one of a voltage, current, and charge.

\* \* \* \* \*